(12) United States Patent
Fan et al.

(10) Patent No.: US 12,272,686 B2
(45) Date of Patent: Apr. 8, 2025

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Fu-Jier Fan, Hsinchu (TW); Alexander Kalnitsky, San Francisco, CA (US); Kong-Beng Thei, Hsinchu Country (TW); Jhu-Min Song, Nantou County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 514 days.

(21) Appl. No.: 17/238,074

(22) Filed: Apr. 22, 2021

(65) Prior Publication Data

US 2022/0352044 A1     Nov. 3, 2022

(51) Int. Cl.
*H01L 23/58*     (2006.01)
*H01L 25/00*     (2006.01)
*H01L 25/065*     (2023.01)

(52) U.S. Cl.
CPC ............ *H01L 25/50* (2013.01); *H01L 23/585* (2013.01); *H01L 25/0657* (2013.01); *H01L 2224/08145* (2013.01); *H01L 2224/80895* (2013.01); *H01L 2224/80896* (2013.01)

(58) Field of Classification Search
CPC ....... H01L 23/585; H01L 2224/08145–08148; H01L 2224/80894–80896; H01L 25/0657
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2014/0124889 A1* | 5/2014 | Qian .................. H01L 27/14618 438/455 |
| 2019/0363079 A1* | 11/2019 | Thei ....................... H01L 23/481 |
| 2021/0265241 A1* | 8/2021 | Wang ..................... H01L 23/564 |
| 2021/0366855 A1* | 11/2021 | Okina ...................... H01L 24/08 |
| 2021/0375790 A1* | 12/2021 | Oda ......................... H01L 24/80 |

(Continued)

*Primary Examiner* — Yu Chen
(74) *Attorney, Agent, or Firm* — WPAT LAW; Anthony King

(57) ABSTRACT

A semiconductor structure and a method for forming a semiconductor structure are provided. The semiconductor structure includes a substrate having an isolation ring extending in the direction substantially parallel to the surface of the substrate, an active region over the substrate and laterally enclosed by the isolation ring, a seal ring structure over the substrate, the seal ring structure laterally enclosing the active region and including at least a wiring layer and at least a via layer, and an encapsulant material laterally enclosing the seal ring structure.

20 Claims, 24 Drawing Sheets

(56) References Cited

U.S. PATENT DOCUMENTS

2022/0077089 A1\* 3/2022 Watanabe ............. H01L 23/562
2022/0192042 A1\* 6/2022 Kabir ...................... H01L 23/02
2022/0301981 A1\* 9/2022 Chang ................... H01L 23/522

\* cited by examiner

SEMICONDUCTOR STRUCTURE AND MANUFACTURING METHOD OF THE SAME

BACKGROUND

The semiconductor industry has continually improved the processing capabilities and power consumption of integrated circuits (ICs) by shrinking the minimum feature size. In an attempt of further increasing the circuit density, the wafer level system integration (WLSI) (also known as wafer-on-wafer (WoW) technology) has been developed. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-10, 11A-11D, 12A-12D, and 13 show a series of cross-sectional views taken along line B-B' in FIG. 1 illustrating some embodiments of the method for manufacturing the 3DIC, in which FIGS. 11A-11D, 12A and 12C show the enlarged views of the circled portion C in FIG. 10, FIG. 12B shows the implant profile taken along line D-D' in FIG. 12A, and FIG. 12D shows the implant profile taken along line E-E' in FIG. 12C.

DETAILED DESCRIPTION

Figure 1:
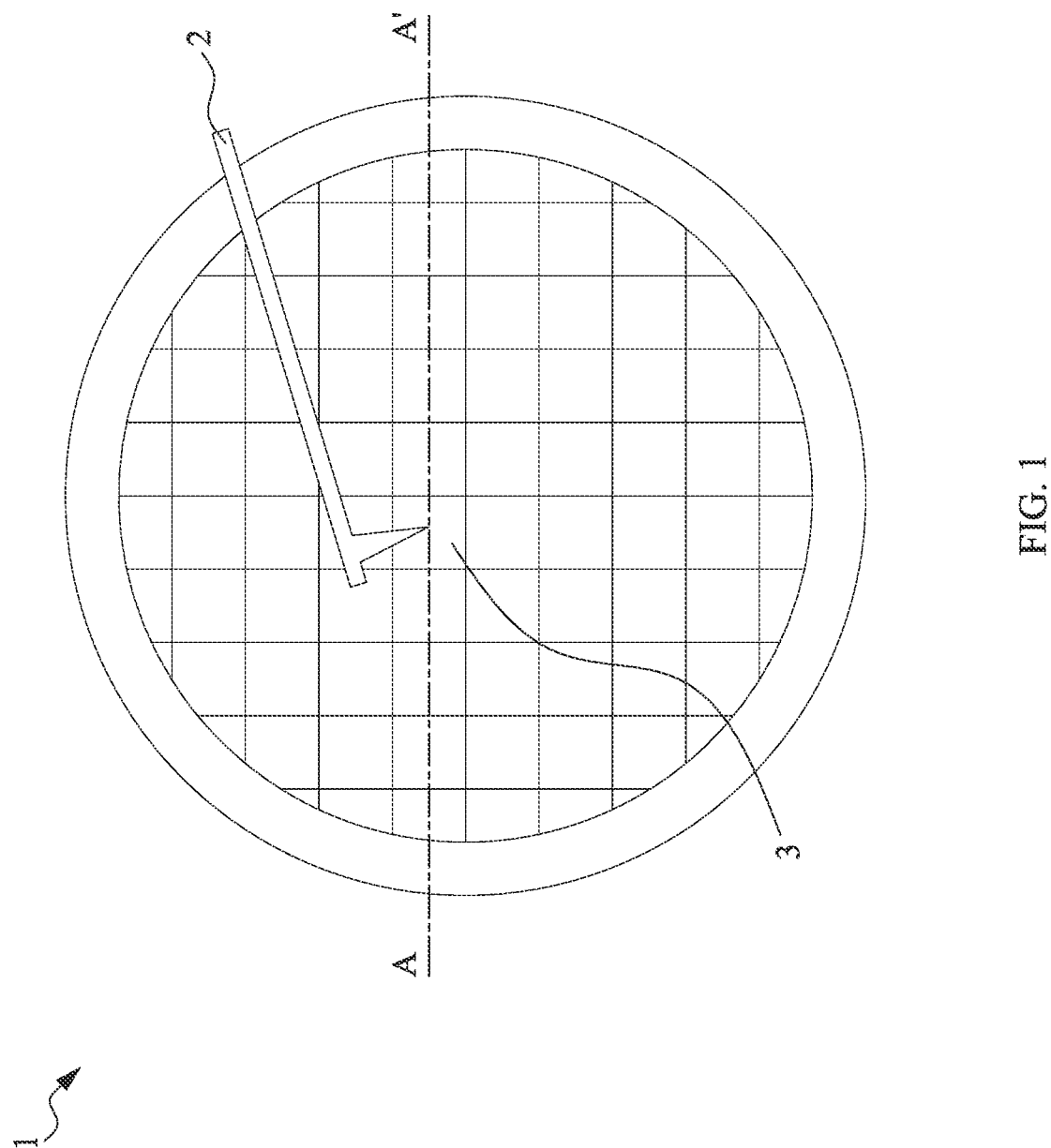
FIG. 1 shows a possible configuration for a chip probing (CP) testing operation of before encapsulation.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In IC manufacturing operation, to save cost and promote production, the known good dies are picked out by a CP testing operation before encapsulation. With reference to FIG. 1, the individual dies on a wafer 1 are tested for functional defects by applying a designed test patterns to them. During a CP test, a set of probers 2 is held in place whilst the die under test 1 on the wafer 2 is moved into electrical contact. After the test of the die 1 has been completed, the set of probers 3 moves to the next die and the next test can start. With the continuous decrease of the technology node, the bias shorting problems between the 3DICs present on the same wafer at a negative substrate bias becomes prominent. This either detriments to the signal-to-noise ratio or diminishes reliability of the CP test. In this art, there is still a need for developing a semiconductor structure that provides an improved signal-to-noise ratio and test reliability under a CP test.

Figure 2:
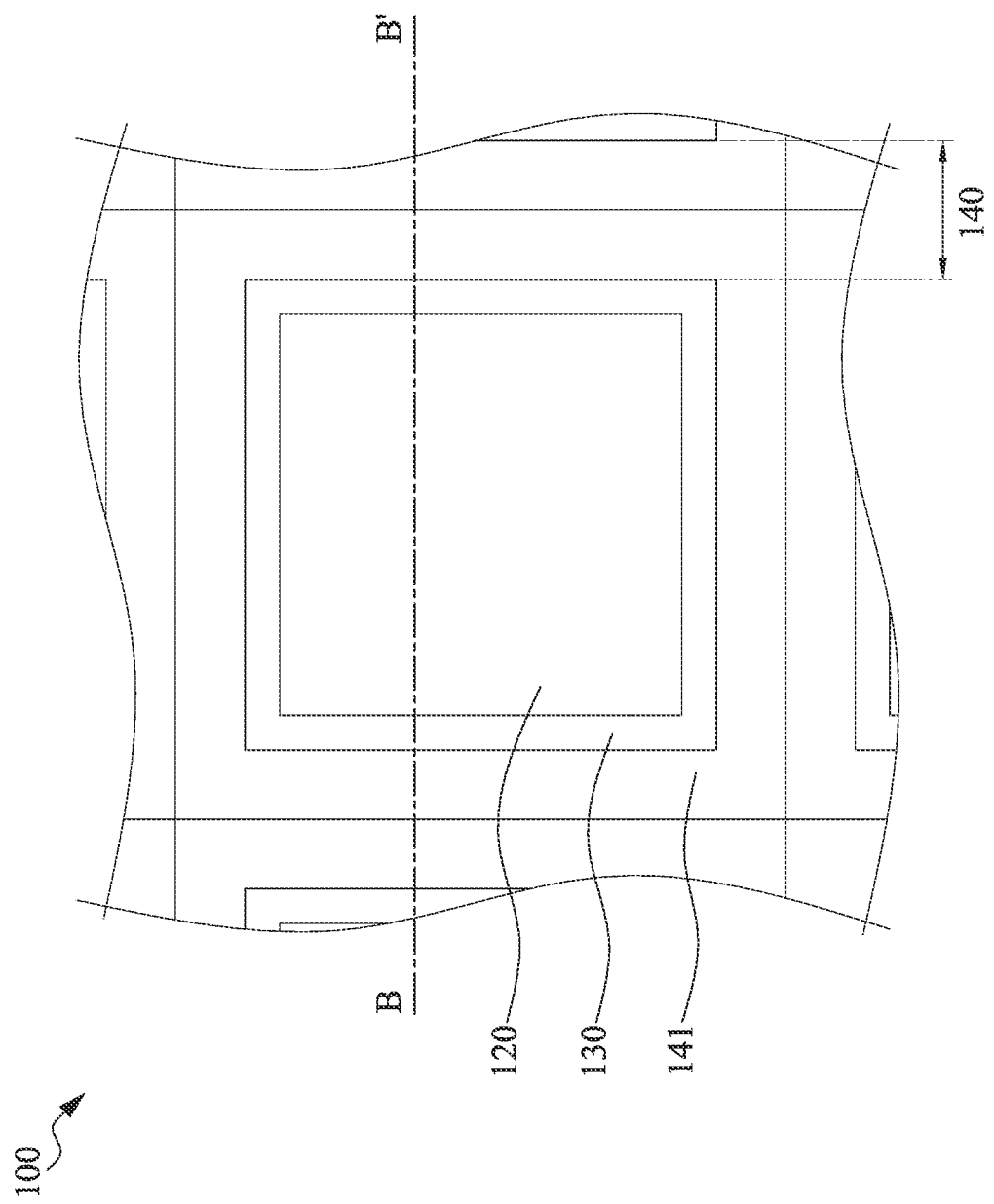
FIG. 2 shows a lay out view of the semiconductor structure according to some embodiments of the present disclosure.

With reference to FIG. 2, a lay out view of the semiconductor structure 100 according to some embodiments of the present disclosure is provided. The semiconductor structure 100, includes an active region 120, a seal ring structure 130 enclosing the active region 120, and a scribe line 140 enclosing the seal ring structure. The relative positions among the active region 120, seal ring structure 130, scribe line 140, and encapsulant material 141 are schematically illustrated. The region at the side of the seal ring structure 130 opposite to the active region 120 is referred to as a scribe line 140. In some embodiments, the scribe line 140 may include an encapsulant material 141 enclosing the seal ring structure 130. The seal ring structure 130 is arranged between the scribe line 140 and the active region 120. The seal ring structure 130 is arranged between the encapsulant material 141 and the active region 120. The seal ring structure may fully enclose the active region 120. The seal ring structure 130 may partially enclose the active region 120. In die-sawing, semiconductor structure 100 can be separated along the scribe lines including scribe line 140.

Figure 3A:
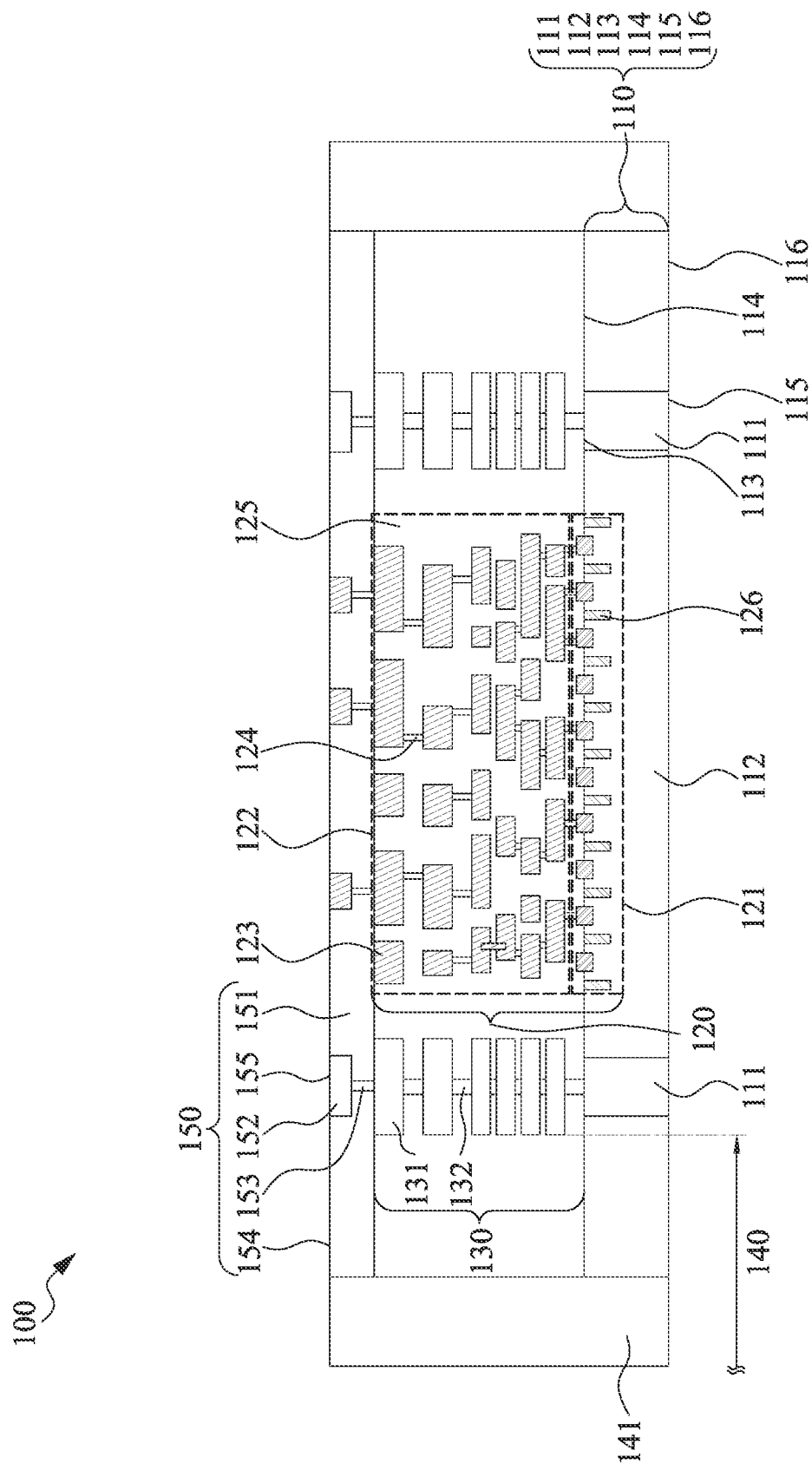
FIG. 3A shows a cross-sectional view taken along line B-B' in FIG. 1 of the semiconductor structure.

FIG. 3A is a cross-sectional view taken along line B-B' in FIG. 1 of the semiconductor structure 100. The semiconductor structure 100, includes a substrate 110 including an isolation ring 111 extending in the direction substantially parallel to a surface 114 of the substrate 110, an active region 120 over the substrate 110 and laterally enclosed by the isolation ring 111, and a seal ring structure 130 over the substrate 110, the seal ring structure 130 laterally enclosing the active region 120. Optionally, an encapsulant material 141 may be disposed to enclose the seal ring structure. In some embodiments, the region between the active region 120 and isolation ring 130 and/or the region between the isolation ring 130 and the encapsulant material 141 and/or the region corresponding to the scribe line 140 may be filled with one or more interlayer dielectric (ILD) materials 125. The ILD material 125 may have a dielectric constant k less than or equal to about 6.

The substrate 110 suitable for the present disclosure may be, but not limited to, a bulk substrate of monocrystalline silicon or some other semiconductor, some other type of substrate, or a combination of the foregoing. The isolation ring 111 laterally or peripherally encloses the active region 120. In this disclosure, the term "laterally" or "peripherally" refers to the peripheral region of an element along the direction substantially parallel to the surface 114 of the substrate 110. The isolation ring 111 extends laterally along the periphery of the active region 120. In this disclosure, the isolation ring 111 may establish an electronically isolated region 112 within the substrate 110. In some embodiments, the surface 113 of the isolation ring 111 and the surface 114 of the substrate 110, both of which are face to the seal ring structure 130, may be in coplanar and parallel relationship. The surfaces 113 and 114 may not be in coplanar relationship but may be in parallel relationship. The surfaces 113 and 114 are in coplanar but not in parallel relationship. The surfaces 113 and 114 are not in either coplanar or parallel relationship. The surface 115 of the isolation ring 111 and the surface 116 of the substrate 110, both of which are face opposite to the seal ring structure 130, may be in coplanar and parallel relationship. The surfaces 115 and 116 may not be in coplanar relationship but may be in parallel relationship. The surfaces 115 and 116 are in coplanar but not in parallel relationship. The surfaces 115 and 116 are not in either coplanar or parallel relationship. In some embodiments, the isolation ring 111 may have an overhang over the surface 116 (not shown in the FIG. 3A).

The active region 120 may include a plurality of transistors 121 and one or more interconnect structures 122 between the transistors 121. In some embodiments, the active region 120 may be an IC, for example, but being not limited to, an insulated-gate field-effect transistor (IGFET), metal-oxide-semiconductor field-effect transistors (MOSFET). In some embodiments, the active region may include metal-insulator-metal (MIM) capacitors, resistive random-access memory (RRAM), or spiral inductors arranged in the interconnect structures 122. The interconnect structure 122 may include one or more wiring layers 123 and one or more via layers 124, which may be arranged alternatively. The interconnect structure 122 may include one or more ILD materials 125 which may enclose the wiring layers 123 and/or via layers 124. Further, in some embodiments, one or more isolation regions 126 can be arranged in the substrate to provide electrical isolation between different electron channels of the transistors 121. The isolation regions 126 may be, but not limited to, shallow trench isolation (STI) regions or deep trench isolation (DTI) regions. The isolation region 126 may have projections at the surface 114 overlaps the isolation ring. The isolation region 126 may be physically connected to the isolation ring 111. The isolation region 126 may not be physically connected to the isolation ring 111.

The seal ring structure 130 can be disposed over the substrate 110. The seal ring structure 130 may be disposed over the isolation ring 111. The seal ring structure 130 may be disposed between the isolation ring 111 and the active region 120. The seal ring structure 130 may be disposed between the isolation ring 111 and the scribe line 140/encapsulant material 141. The seal ring structure 130 may be physically connected to the isolation ring 111. The seal ring structure 130 may not be physically connected to the isolation ring 111. The seal ring structure 130 may proximate the edges of the semiconductor structure 100 (see FIG. 2).

The seal ring structure 130 laterally or peripherally encloses the active region 120. The seal ring structure extends laterally along the periphery of the active region 120. In this disclosure, the seal ring structure 130 may protect the active region 120 from a die saw singulating the semiconductor structure 100 and/or may reduce the species diffusing into the active region 120 from an ambient environment or encapsulant material 141. The seal ring structure 130 may constitute a continuous wall or barrier along the direction substantially normal to the surface 114 of the substrate 110 for robust reliability and performance.

The seal ring structure 130 includes at least a wiring layer 131 and at least a via layer 132. In some embodiments, the wiring layers 131 and via layers 132 are concentrically aligned. In some embodiments, the wiring layers 131 may be present in a ring shape that extends along the direction substantially parallel to the surface 114 of the substrate 110 or extends laterally along the periphery of the active region 120. The via layers 132 may be present in a ring shape that extends along the direction substantially parallel to the surface 114 of the substrate 110 or extends laterally along the periphery of the active region 120. The ring shape of the wiring layer 131 or via layer 132 may be either continues or discontinuous. The seal ring structure 130 can be physically and/or electrically separated from the active region by the ILD material 125 and can be spaced as close to the active region 120 as possible to reduce the overall die area. The materials suitable for the wiring layers 131 or via layers 132 may be, but are not limited to, metal, polysilicon or active silicon. In some embodiment, the seal ring structure 130 may be at a ground potential.

In some embodiments, a hybrid bond (HB) structure 150 may be arranged over the seal ring structure 130, the HB structure 150 may include at least an HB dielectric layer 151, at least an HB link layer 152, and at least an HB contact layer 153. The HB dielectric layer 151 and the HB link layer 152 provide an interface to be connected with another semiconductor structure so as to form a 3DIC as described below. The HB link layer 152 may be sunken into the HB dielectric layers 151 and enclosed by the HB dielectric layer 151. The surface 154 of the HB dielectric layer 151 and the surface 155 of the HB link layer 152 can be in coplanar and parallel relationship. The HB link layer 152 can be connected to the seal ring structure 130 by way of the HB contact layer 153. The HB link layer 152 can be connected to the wiring layer 131 of the seal ring structure 130 by way of the HB contact layer 153. The HB link layer 152 can be connected to the via layer 132 of the seal ring structure 130 by way of the HB contact layer 153. The HB contact layer 153 can extend from the seal ring structure 130 to the HB link layer 152.

The HB link layer 152 and HB contact layer 153 are conductive. The material of the HB link layer 152 and HB contact layer 153 suitable for the present disclosure may be, but not limited to, copper, aluminum, tungsten, some other conductive material, or a combination of the foregoing. The materials of the HB dielectric layer 151 suitable for the present disclosure may be, but not limited to, silicon dioxide, silicon nitride, silicon oxynitride, silicon carbide, some other dielectric, or a combination of the foregoing. In some embodiments, the HB link layer 152 may be integrated with and/or be of the same material as the HB contact layer 153. In other embodiments, the HB link layer 152 may be distinct from and/or be of different materials than the HB contact layer 153.

In some embodiments, the semiconductor structure 100 may be encapsulated by the encapsulant material 141. The encapsulant material 141 may laterally or peripherally encloses the substrate 110. The encapsulant material 141 may laterally or peripherally encloses the isolation ring 111. The encapsulant material 141 may laterally or peripherally encloses active region 120. The encapsulant material 141 may laterally or peripherally encloses the seal ring structure 130. The encapsulant material 141 may laterally or peripherally encloses the HB structure 150. In some embodiments, the encapsulant material 141 may be disposed at the position corresponding to the scribe line 140. The encapsulant material 141 may have a projection at the surface 114 that is within the scribe line 140. The encapsulant material 141 may be disposed over the substrate 110. The encapsulant material 141 may be physically connected to the substrate 110. The encapsulant material 141 may be physically connected to the seal ring structure 130. The encapsulant material 141 may not be physically connected to the seal ring structure 130.

Figure 3B:
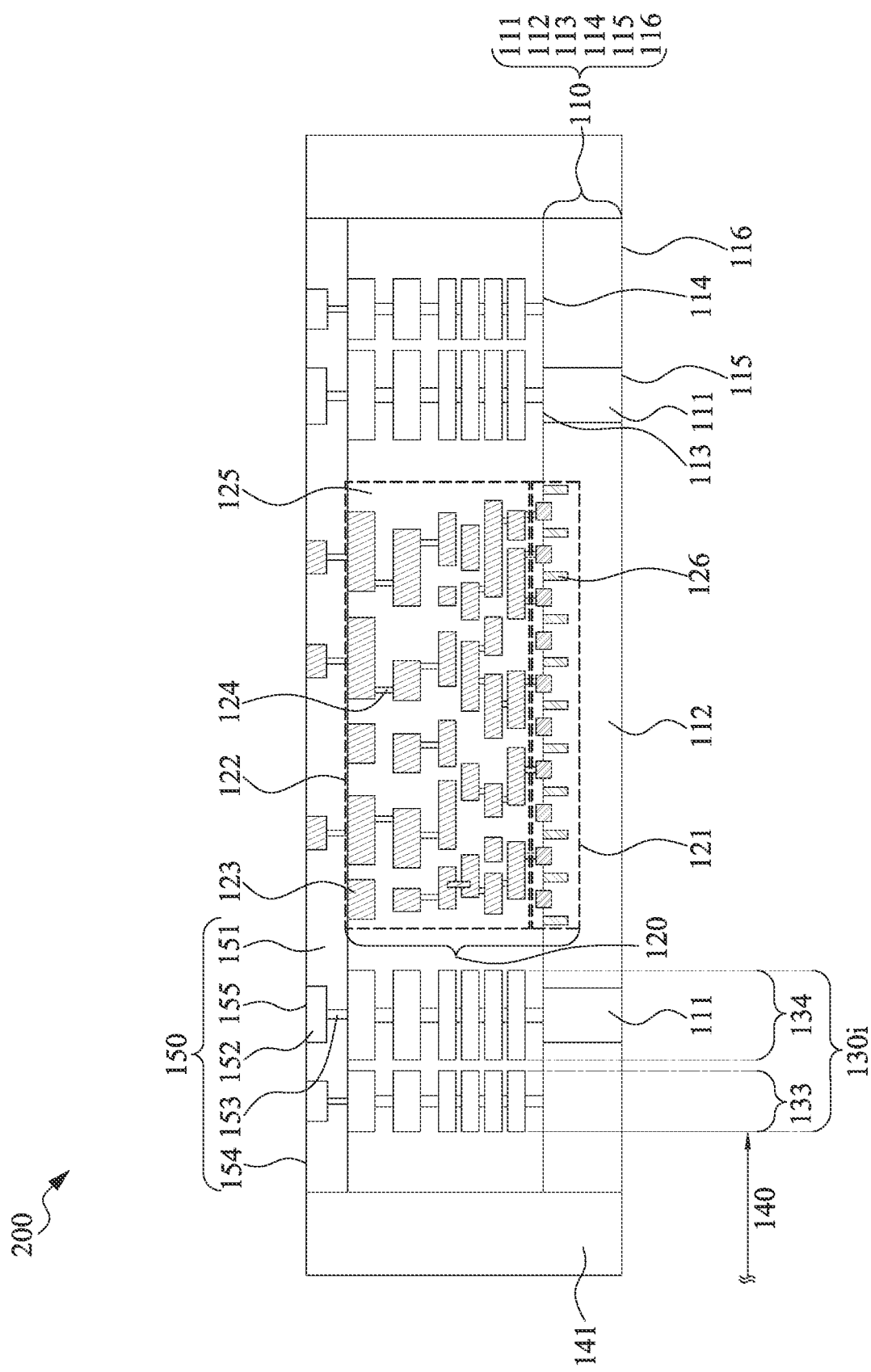
FIG. 3B shows a cross-sectional view taken along line B-B' in FIG. 1 of the semiconductor structure according to some embodiments of the present disclosure.

FIG. 3B shows a semiconductor structure 200 according to some embodiment of the present disclosure. Except for the seal ring structure 130, the semiconductor structure 200 is substantially the same as the semiconductor structure 100 illustrated in FIG. 3A. Specifically, the seal ring structure 130i of the semiconductor structure 200 includes a seal ring 133 closer to the scribe line 140 or encapsulant material 141 (alternatively referred to as a sacrificial seal ring), and a seal ring 134 closer to the active region 120 (alternatively referred to as a main seal ring). The seal ring 133 may have an outer edge substantially aligned to the boundary of the scribe line 140. The seal ring 134 may have a ring width wider than that of the seal ring 133.

In this disclosure, if a seal ring structure includes two or more seal rings, the isolation ring 111 can be physically connected to any of the seal rings. The isolation ring 111 can be physically connected to at least one of the seal rings. The isolation ring 111 can be physically connected to more than one seal ring at the same time, Taking the seal ring structure 130i as an example, the seal ring 133 may be disposed over the isolation ring 111. The seal ring 134 may be disposed over the isolation ring 111. The seal ring 133 may be physically connected to the isolation ring 111. The seal ring 134 may be physically connected to the isolation ring 111. The seal ring 133 may not be physically connected to the isolation ring 111. The seal ring 134 may not be physically connected to the isolation ring 111.

Figure 3C:
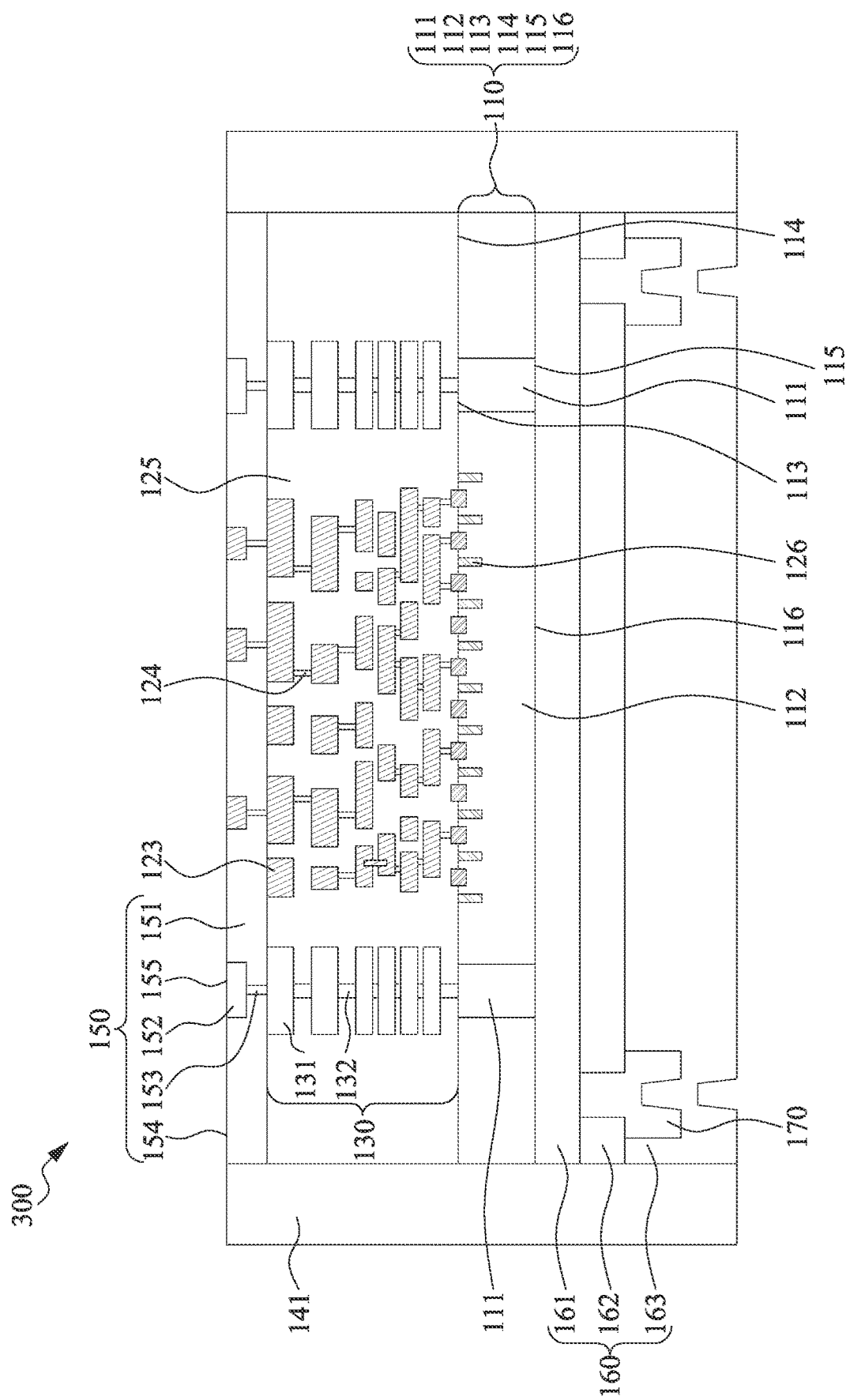
FIG. 3C shows a cross-sectional view taken along line B-B' in FIG. 1 of the semiconductor structure according to some embodiments of the present disclosure.

FIG. 3C shows a semiconductor structure 300 according to some embodiments of the present disclosure. Except for the presence of a passivation layer 160 and one or more pad electrodes 170 over the surface 116 of the substrate 110, the semiconductor structure 300 is substantially the same as the semiconductor structure 100 illustrated in FIG. 3A. The passivation layer 160 may include one or more dielectric layers, such as layers 161 to 163 illustrated in FIG. 3C. The passivation layer 160 may further include one or more pad electrodes 170. The pad electrodes 170 may be electrically connected to the active region 120. The pad electrodes 170 may be electrically connected to the seal ring structure 130. The pad electrodes 170 can be physically connected to the active region 120 by way of one or more through silicon vias (not shown in FIG. 3C). The pad electrodes 170 can be physically connected to the seal ring structure 130 by way of one or more through silicon vias (not shown in FIG. 3C). The pad electrodes 170 may be enclosed by the dielectric layer 162. The pad electrode may be enclosed by the dielectric layer 163. The pad electrodes 170 may have projections at the surface 113 that are enclosed by the isolation ring 111. The pad electrodes may 170 have projections at the surface 114 that are excluded by the isolation ring 111. The pad electrodes may 170 have projections at the surface 114 that are between the seal ring structure 130 and the active region 120. The pad electrodes may 170 have projections within the scribe lines 140.

The materials of the dielectric layers 161 to 163 suitable for the present disclosure may be, but not limited to, silicon dioxide, silicon nitride, silicon oxynitride, silicon carbide, some other dielectric, or a combination of the foregoing. Further, the dielectric layers 161 to 163 may be of the same material or different materials. The materials of the pad electrodes 170 suitable for the present disclosure may be, but not limited to, copper, aluminum, aluminum copper, tungsten, some other conductors, or a combination of the foregoing.

Figure 4A:
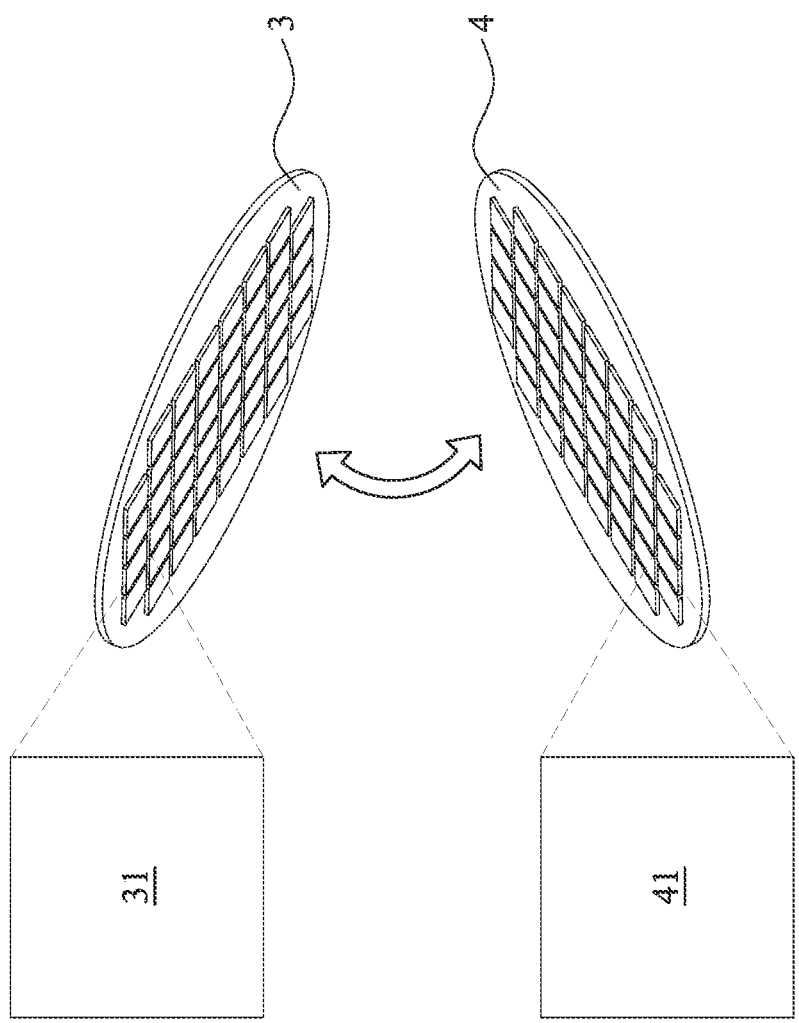
FIG. 4A shows a possible operation for forming a 3DIC.

As described above, 3DIC provides both homogeneous and heterogeneous integration from front to back end, and is suitable for high-yield, same-die-size wafer integration. One advantage of 3DICs is the flexibility of combining two semiconductor structures with different functions. For example, a display driver integrated circuit (DDIC) may be stacked with an advanced high performance computing (HPC) cell; a power management integrated circuit (PMIC) may be stacked with a flash memory cell. As illustrated in FIG. 4A, in the operation of forming a 3DIC, two wafers 3 and 4 are bonded together and electrical connections are formed between each of the chips 31 and 41 on the wafers 3 and 4, respectively, through HB structures. For example, bonding wafers 3 and 4 may be accomplished by attaching the wafer 3 on top of the wafer 4. The stacked wafers 3 and 4 are then bonded to a carrier substrate (not shown in FIG. 4A) and wire bonds electrically couple the pad electrodes of the bonded wafers 3 and 4 to the pads on the carrier substrate.

Figure 4B:
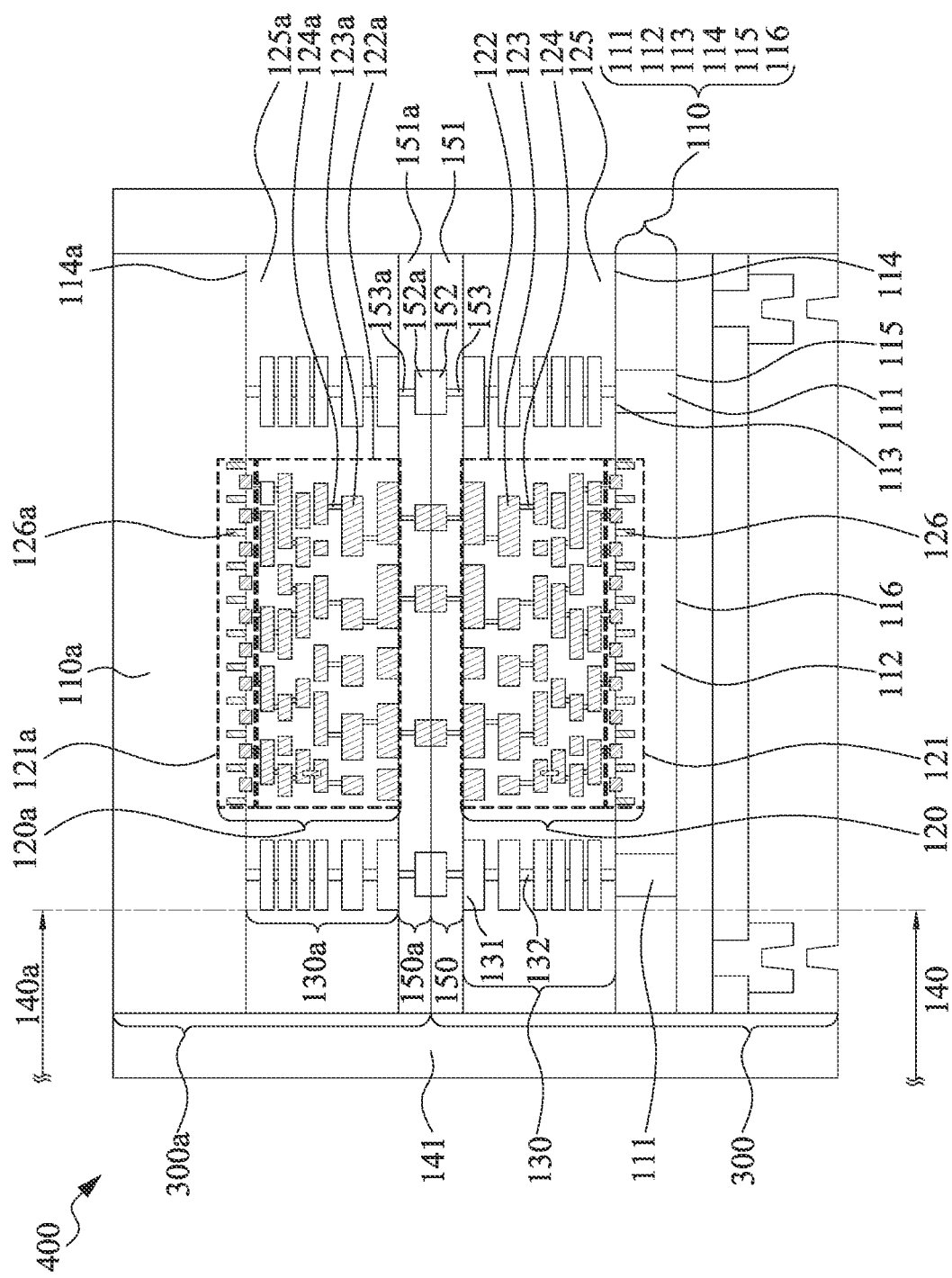
FIG. 4B shows a cross-sectional view taken along line B-B' in FIG. 1 of a 3DIC according to some embodiments of the present disclosure.

The semiconductor structures according to the present disclosure are suitable for forming 3DICs. With reference to FIG. 4B, a cross-sectional view of a 3DIC 400 according to some embodiments of the present disclosure is provided. The 3DIC 400 includes the semiconductor structure 300 as described above and another semiconductor structure 300a over the semiconductor structure 300. Except for the presence of the isolation ring 111 in the substrate 110 of the semiconductor structure 100, the semiconductor structure 300a may have the same structure as that of the semiconductor structure 100 as illustrated FIG. 3A. The semiconductor structures 300 and 300a pertain to 2DIC dies, and include respective substrates 110 and 110a and between the substrates 110 and 110a, respective active regions 120 and 120a, respective seal ring structures 130 and 130a, and respective HB structures 150 and 150a. The semiconductor structures 300 and 300a may be, but not limited to, MOSFETs, IGFETs, DDIC cells, HPC cells, PMIC cells, MIM capacitors, flash memory cells, or the like. In some embodiments, the 3DIC 400 may include a substrate 110 including an isolation ring 111 extending in the direction substantially parallel to the surface 114 of the substrate 110, a seal ring structure 130 over the substrate 110, the seal ring structure 130 including at least a wiring layer 131 and at least a via layer 132, and an HB structure 150 over the seal ring structure 130, an HB structure 150a over the HB structure 150, a seal ring structure 130a over the HB structure 130a, and a substrate 110a over the seal ring structure 130a, wherein the seal ring structure 130 extends from the substrate 110 to the HB structure 150, and the seal ring structure 130a extends from the bonding structure 150a to the substrate 110a.

In some embodiments, the substrate 110a of the semiconductor structure 300a may include one or more isolation rings, of which the arrangement in the substrate 110a and material are substantially the same as the isolation ring 111 as described above (not shown in FIG. 4B). The substrates 110 and 110a are spaced from one another, respectively under the seal ring structure 130 and over the seal ring structure 130a. The substrates 110 and 110a may have different thicknesses. For example, the substrate 110 may have a thickness T and the substrate 110a may have a thickness Ta greater than the thickness T. In some embodiments, the seal ring structures 130 and 130a together with the HB structures 150 and 150a as a whole extend from the substrate 110 to substrate 110a, such that they protect the active regions 120 and 120a from a die saw and/or gases diffusing into the active regions 120 and 120a. In some embodiments, the HB link layers 152 and 152a contact with each other to constitute a conductor-to-conductor interface and are electrically coupled to the interconnect structures 121 and 121a, respectively, by the HB contact layers 153 and 153a. The HB contact layers 153 and 153a extend respectively from the HB link layers 152 and 152a respectively to the interconnect structures 121 and 121a. The HB link layers 152 and 152a are electrically coupled to the seal ring structures 130 and 130a, respectively, by the HB contact layers 153 and 153a. The HB contact layers 153 and 153a extend respectively from the HB link layers 152 and 152a respectively to the seal ring structures 130 and 130a.

Since the semiconductor structure 300a is similar to the semiconductor structure 100 described above, the material and the arrangement of each of the components in semiconductor structure 300a are not be repeated herewith.

With reference to FIGS. 5-10, 11A-11D, 12A-12D, and 13, a series of cross-sectional views illustrating some embodiments of a method for manufacturing the 3DIC 400 as illustrated in FIG. 4B. As illustrated by the cross-sectional view of FIG. 5, an ILD material 125 including two ILD layers 127 and 128 is formed over a substrate 110 on which one or more transistors 121 are formed. For example, a lower layer 127 of the ILD material 125 is formed covering the substrate 110 and transistors 121, and an upper layer 128 of the ILD material 125 is subsequently formed covering the lower layer 127. The ILDs layers 127 and 128 are formed stacked and may, for example, be formed by vapor deposition (e.g., chemical or physical vapor deposition), atomic layer deposition, thermal oxidation, some other growth or deposition operation, or a combination of the foregoing. Further, the ILD material 125 may be formed of, for example, silicon dioxide, a low k dielectric, some other dielectric, or the like.

In some embodiments, an etch stop layer (not shown in FIG. 5) is formed between the upper layer 128 and the lower layer 127. The etch stop layer is different from the ILD material 125 in their materials and may be, but not limited to, silicon nitride. Further, in some embodiments, the upper layer 128 and lower ILD 127 may be integrated together and/or are of the same material.

Figure 6:
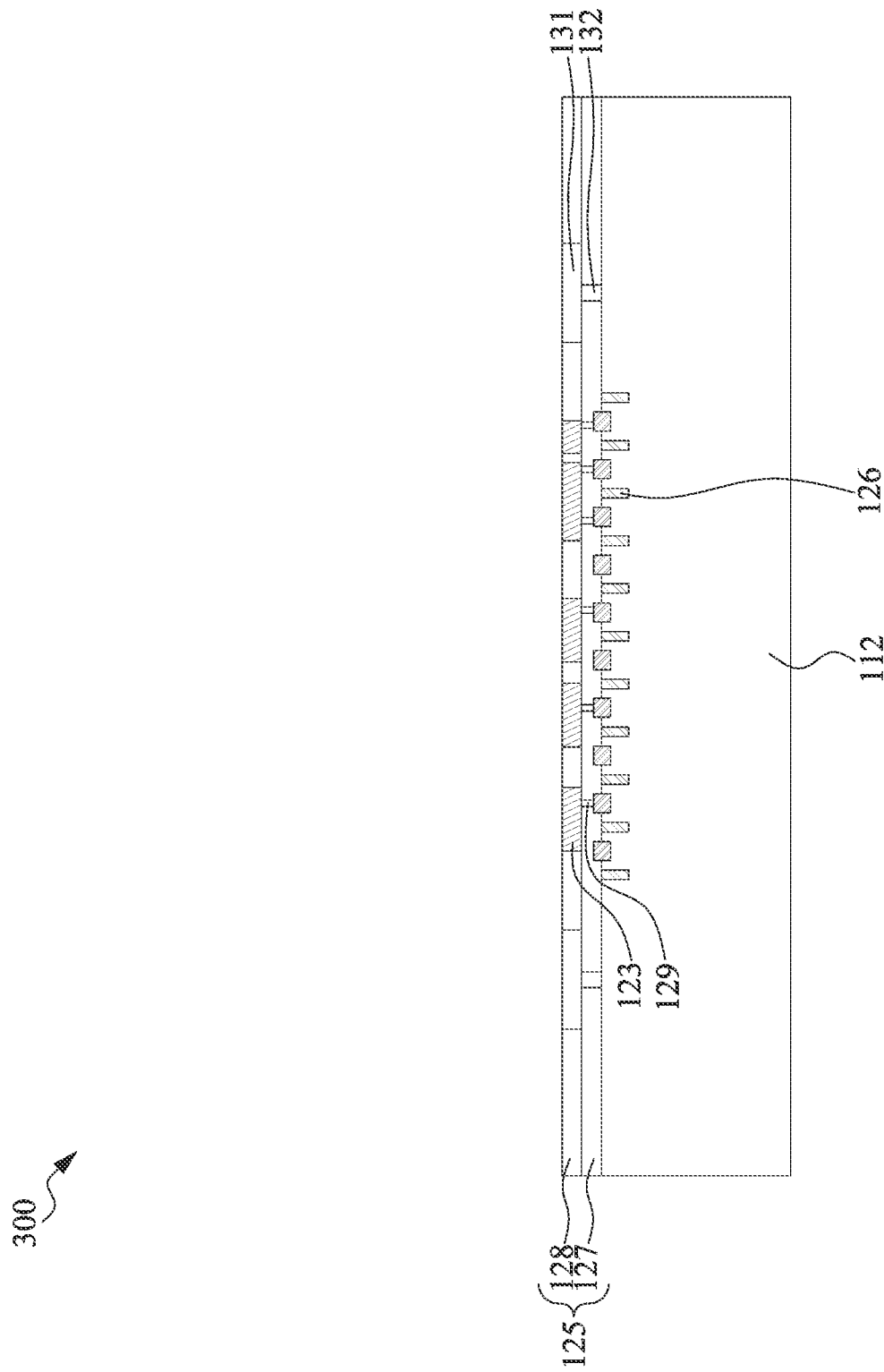

As illustrated by the cross-sectional view of FIG. 6, a transistor contact layer 129 and a wiring layer 123 are formed respectively in the ILD layers 127 and 128. For example, the wiring layer 123 may be formed sunken into an upper layer 128 of the ILD layers, and the transistor contact layer 129 may be formed extending from the wiring layer 123, through the lower layer 127, to the substrate 110. Further, a wiring layer 131 and a via layer 132 are formed as a segment of the seal ring structure 130.

The operation for forming the wiring layer 123/131, the transistor contact layer 129, and via layer 132 includes performing a first selective etch into the upper layer 128 to form first openings in the upper layer 128 with a pattern of the wiring layer 123/131. The first selective etch may stop, for example, on an etch stop layer (not shown in FIG. 6) between the ILD layers 127 and 128. Thereafter, a second selective etch is performed on the lower layer 127 to form second openings in the lower layer 127 with a pattern of the transistor contact layer 129 and via layer 132. A conductive material is formed filling the first and second openings, and a planarization is performed to coplanarize an upper or top surface of the conductive material with an upper or top surface of the upper layer 128, whereby the wiring layer 123/131, the transistor contact layer 129, and via layer 132 are formed from the conductive material. The first and second selective etches may be performed selectively by, for example, photolithography, and/or the planarization may be performed by, for example, chemical mechanical polish (CMP).

Figure 5:
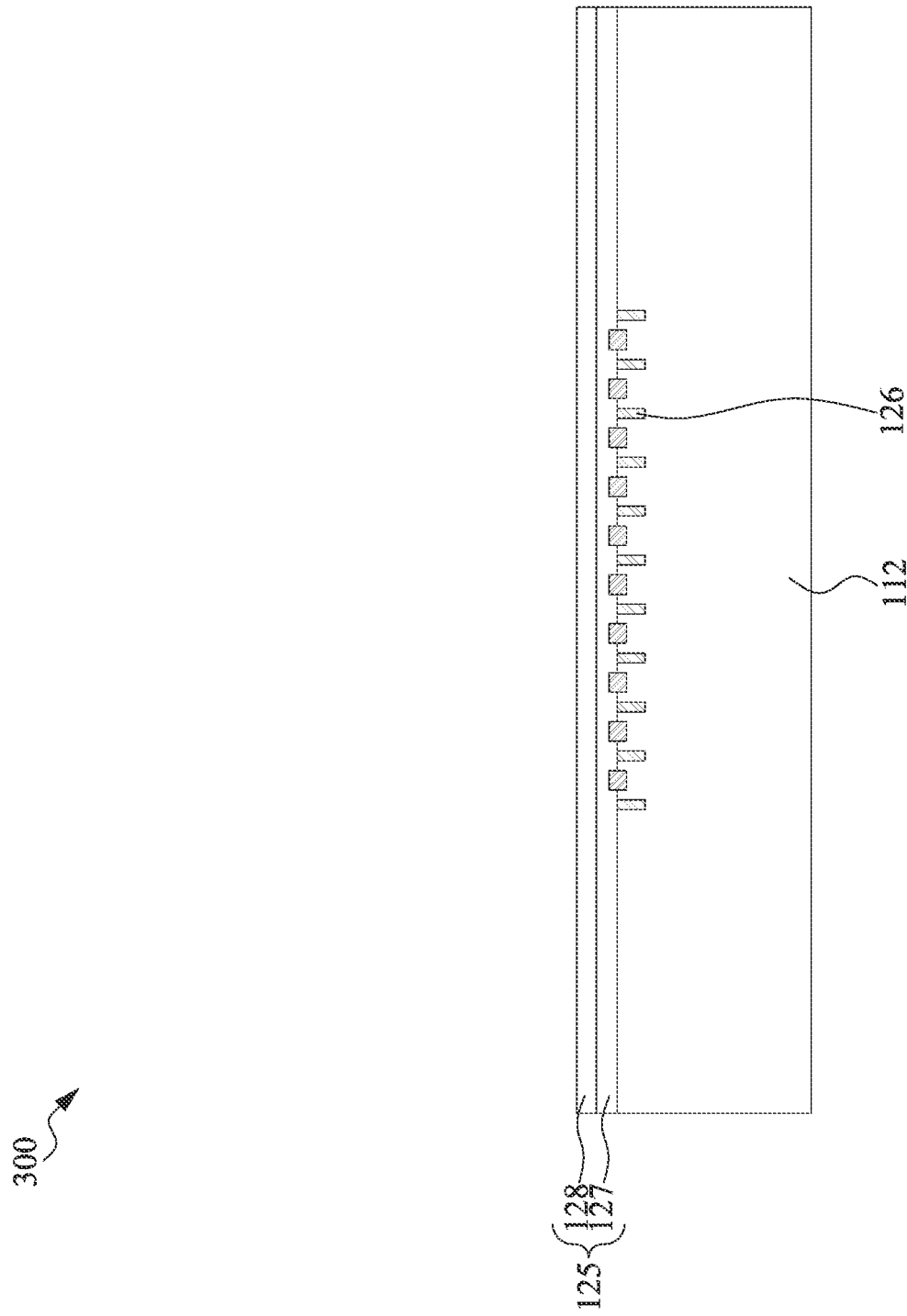
Figure 7:
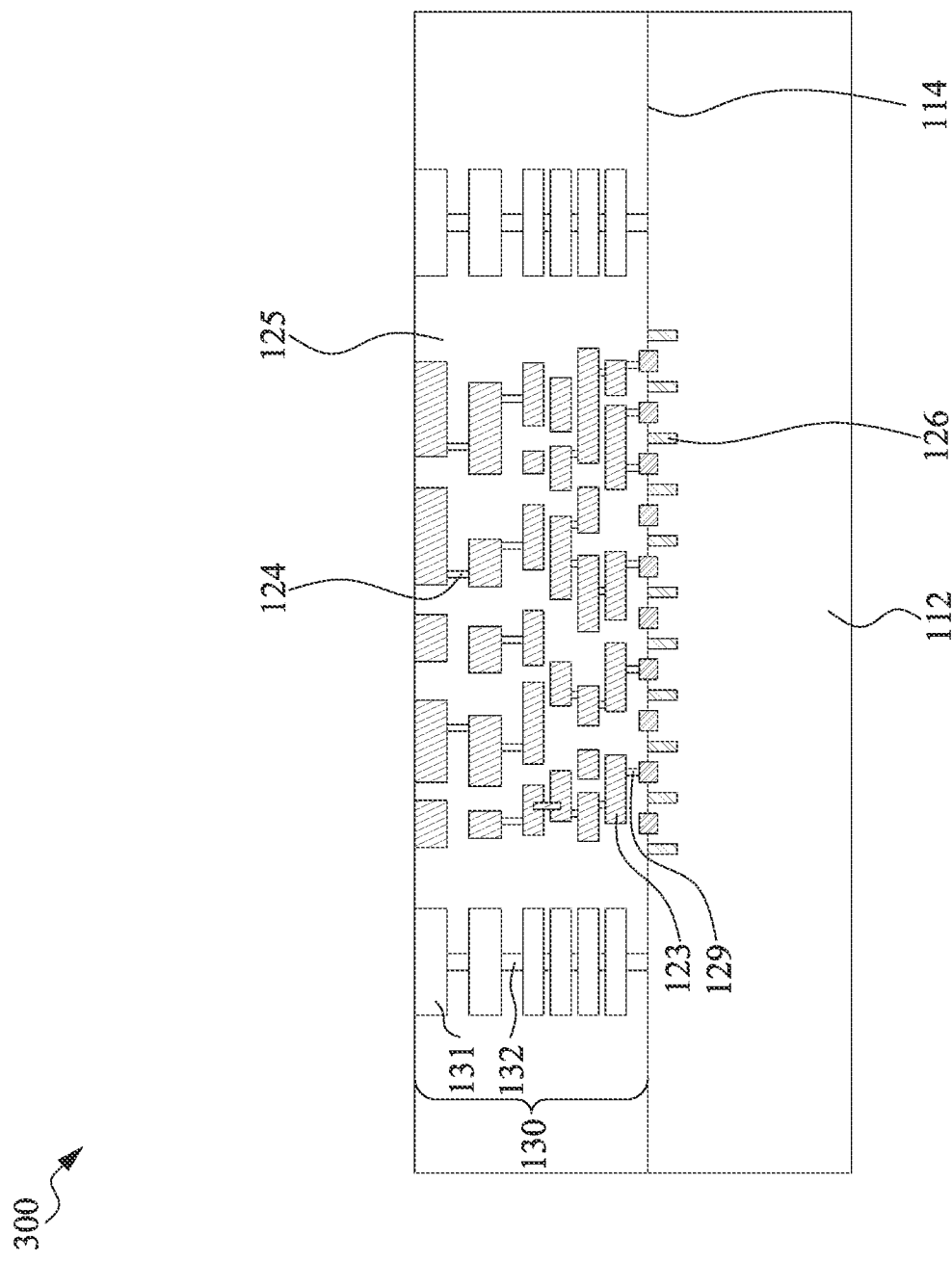

As illustrated by the cross-sectional view of FIG. 7, the acts of FIGS. 5 and 6 are repeated one or more times. As such, one or more additional ILD materials 125 are formed stacked over the substrate 110, each accommodating an additional wiring layer 123/131 and a via layer 132/153. The ILD material 125, the wiring layers 124, the transistor contact layer 129, and the inter-wire via layers 123 collectively constitute the interconnect structure 122. The ILD material 125, the wiring layers 131, and the via layers 132 collectively constitute the seal ring structure 130.

Figure 8:
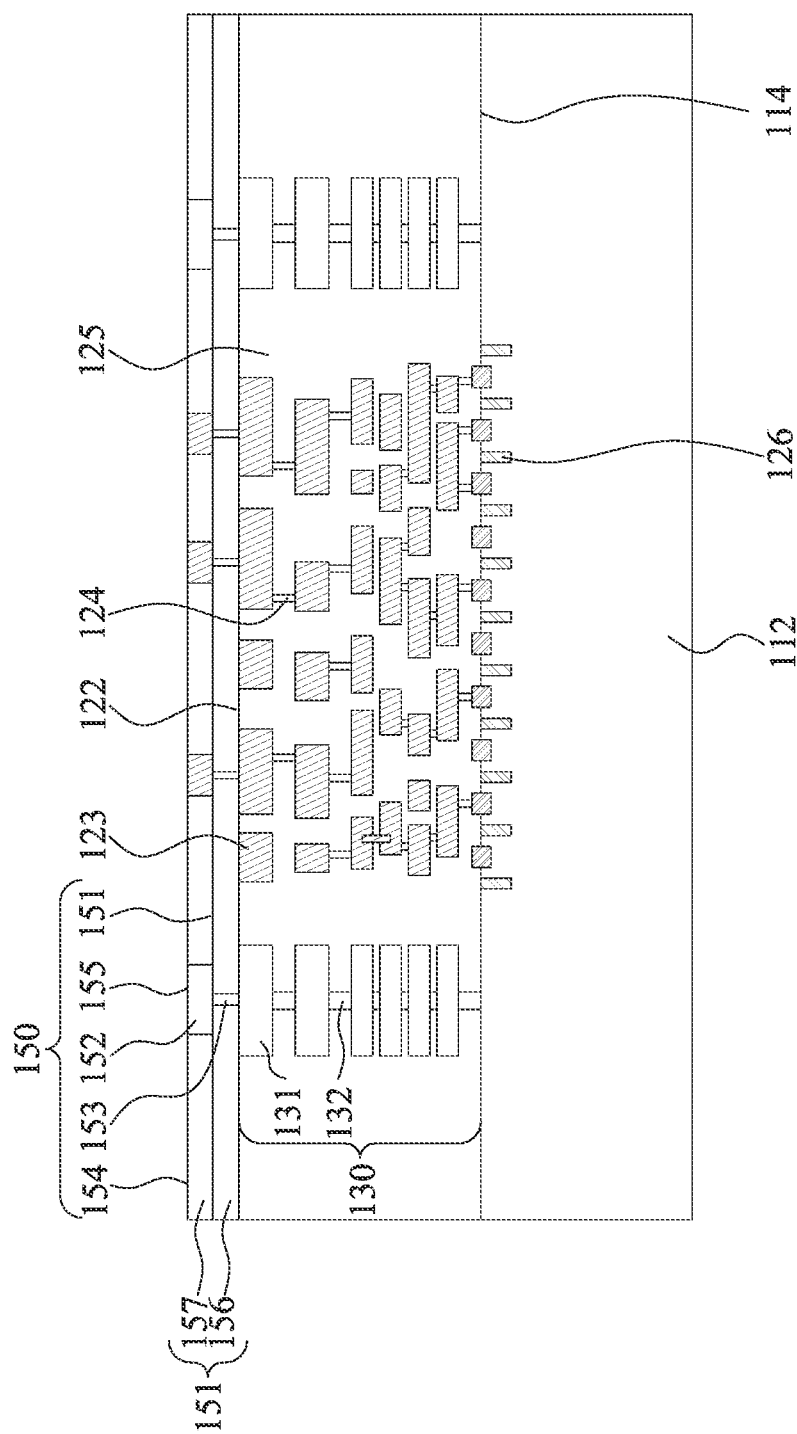

As illustrated by the cross-sectional view of FIG. 8, a pair of HB dielectric layers 151 is formed over the interconnect structure 122 and the seal ring structure 130. For example, a lower layer 156 of the HB dielectric layers 151 is formed covering the interconnect structure 122 and the seal ring structure 130, and an upper layer 157 of the HB dielectric layers 151 is subsequently formed covering the lower layer 156. The HB dielectric layers 151 may be formed, for example, in the same manner or a similar manner as described for the ILD material 125 in FIG. 5.

In some embodiments, an etch stop layer (not shown in FIG. 8) is formed between the upper HB dielectric layer 157 and the lower HB dielectric layer 156. The etch stop layer is different from the pair of HB dielectric layers 151 in their materials and may be, but not limited to, silicon nitride. Further, in some embodiments, the upper HB dielectric layer 157 and lower HB dielectric layer 156 may be integrated together and/or are of the same material.

Further, while the acts of FIG. 8 illustrate and describe a dual-damascene-like operation for forming the HB link layer 152 and the HB contact layer 153, a single-damascene-like operation may alternatively be employed to form the HB link layer 152 and the HB contact layer 153 in other embodiments.

Figure 9:
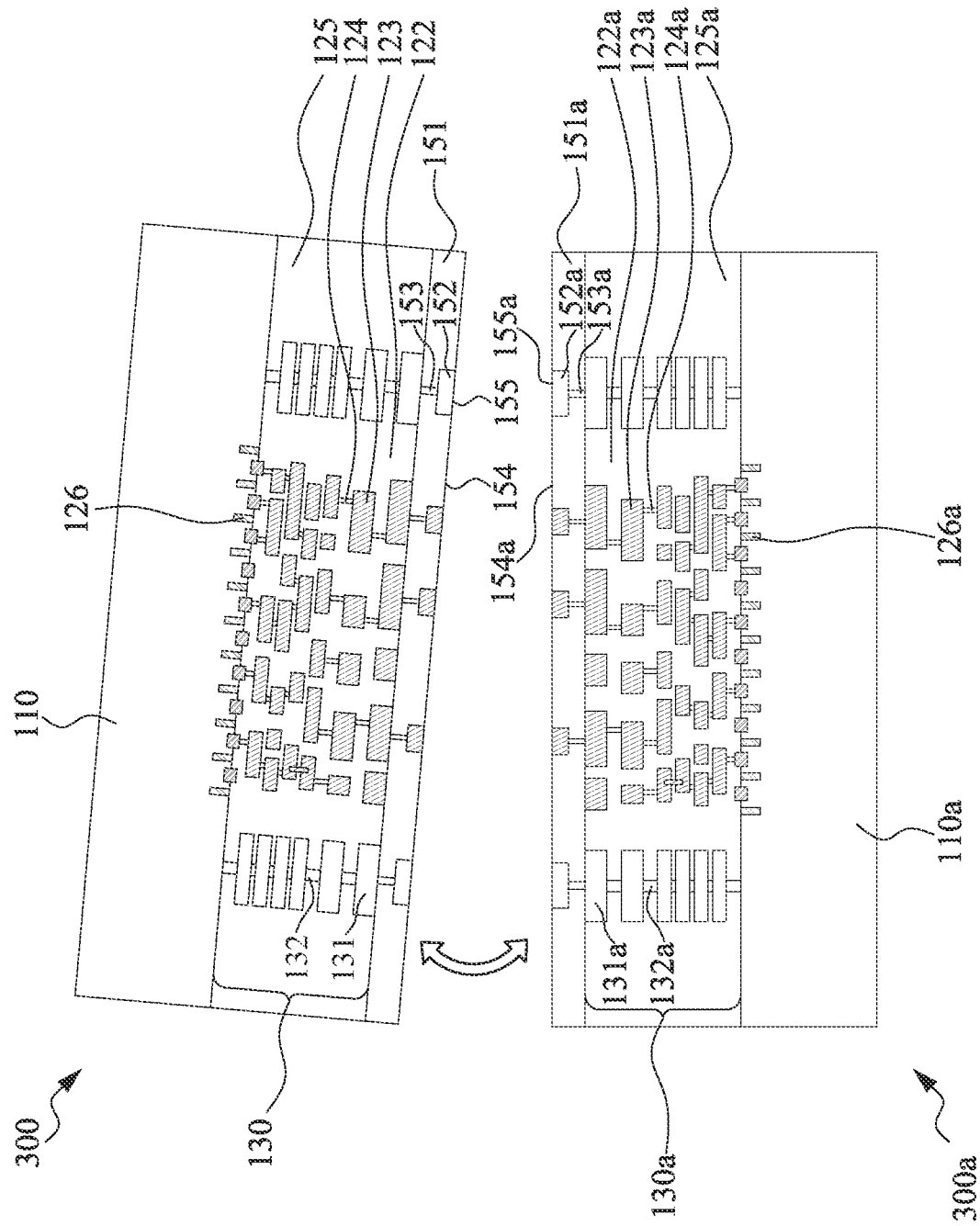

As illustrated by the cross-sectional view of FIG. 9, the semiconductor structure 300a is formed in a similar manner as described for the semiconductor structure 300 in FIGS. 5-8. As such, the semiconductor structure 300a have the structure as described above. Thereafter, the semiconductor structure 300 is flipped and bonded to the semiconductor structure 300a, such that the HB structures 150 and 150a are connected to each other to constitute an HB. The HB includes a dielectric-to-dielectric bond between the HB dielectric layers 151 and 151a and a conductor-to-conductor bond between the HB link layers 152 and 152a. The operation for bonding the semiconductor structure 300 to the semiconductor structure 300a may include, for example, fusion bonding operations and/or metallic bonding operations.

Figure 10:
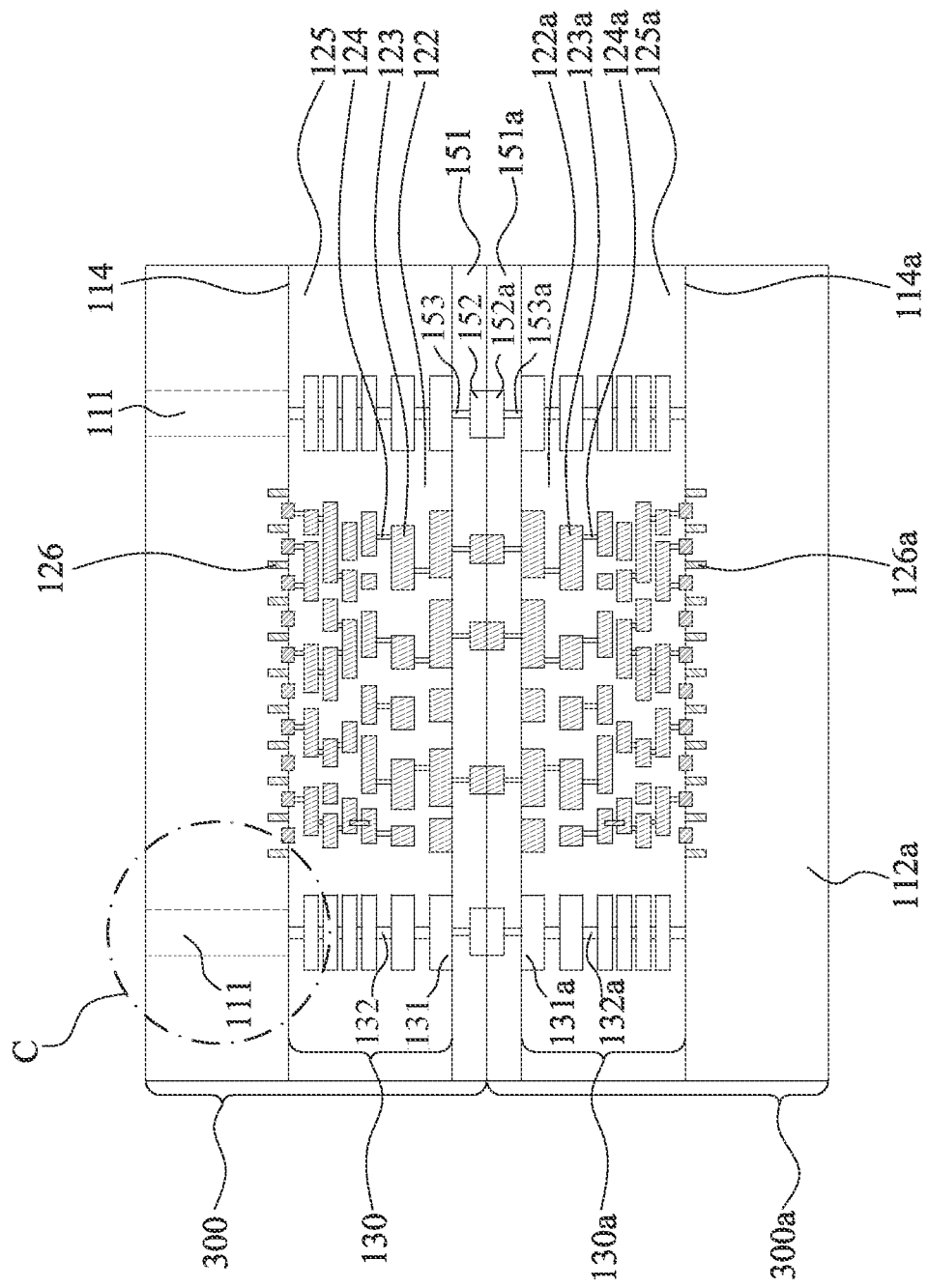

FIG. 10 identifies the position of isolation ring 111 to be formed in the substrate 110 according to some embodiments of the present disclosure. FIGS. 11A-11D, 12A and 12C show the enlarged views of the circled portion C in FIG. 10. As illustrated by the cross-sectional view of FIG. 11A, in some embodiments, a through substrate trench 117 is formed extending through the substrate 110 from the surface 116 to surface 114. In particular, ad etching operation is performed on the substrate 110 to form a through substrate trench 117. The etching operation may be performed selectively by, for example, photolithography. The through substrate trench 117 may be formed over the seal ring structure 130 and laterally between a neighboring scribe line 140 and the active region 120. Further, the via layer 132 may serve as an etching stop layer, such that the through substrate trench 117 is formed extending from the surface 116 to a via layer 132 of the seal ring structure 130 nearest the substrate 110, thereby exposing the via layer 132. As illustrated by the cross-sectional view of FIG. 11B, in some embodiments, if the via layer connecting the wiring layer 131 and the substrate 110 is absent, the wiring layer 131 may serve as an etching stop layer, such that the through substrate trench 117 is formed extending from the surface 116 to a wiring layer 131 of the seal ring structure 130 nearest the substrate 110, thereby exposing the wiring layer 131.

The through substrate trench 117 may have a shape corresponding to the isolation ring 111. In some embodiments, the cross-section of the through substrate trench 117 along line B-B' in FIG. 2 has a tapered shape with a maximum width of $W_1$ and a minimum width of $W_2$, where about 200 nm about 10 μm and about 50 nm≤$W_2$≤about 9 μm. $W_1$ may be, for example but not limited to, 200 nm, 300 nm, 400 nm, 500 nm, 600 nm, 700 nm, 800 nm, 900 nm, 1 μm, 1.5 μm, 2 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm or 10 μm. $W_2$ may be, for example but not limited to, 50 nm, 100 nm, 200 nm, 300 nm, 400 nm, 500 nm, 600 nm, 700 nm, 800 nm, 900 nm, 1 μm, 1.5 μm, 2 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm or 9 μm. In some embodiments, one of the sidewalls of the through substrate trench 117 may have tilt angle of about 30° to <90° with respect to the surface 114. The tilt angle may be, for example but not limited to, 30°, 40°, 50°, 60°, 70°, 80° or 85°. In some embodiments, the cross-section of the through substrate trench 117 along line B-B' in FIG. 2 has a rectangle shape with a width of about 200 nm to about 10 μm, for example but being not limited to, 200 nm, 300 nm, 400 nm, 500 nm, 600 nm, 700 nm, 800 nm, 900 nm, 1 μm, 1.5 μm, 2 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm or 10 μm. In some embodiments, the through substrate trench 117 may have a height-to-width aspect ratio of about 0.5 to about 5, for example but not limited to 0.5, 0.6, 0.7, 0.8, 0.9, 1, 1.5, 2, 2.5, 3, 3.5, 4, 4.5 or 5.

Figure 11A:
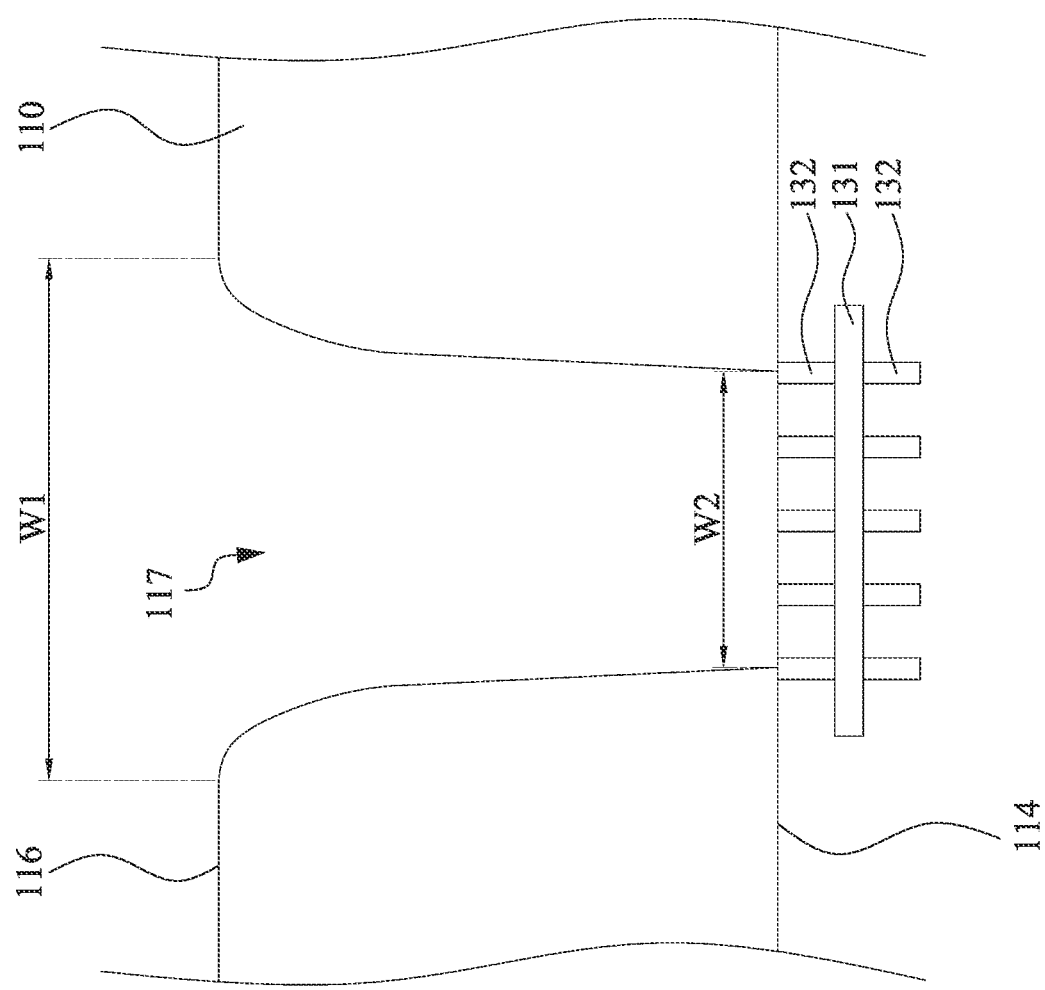
Figure 11B:
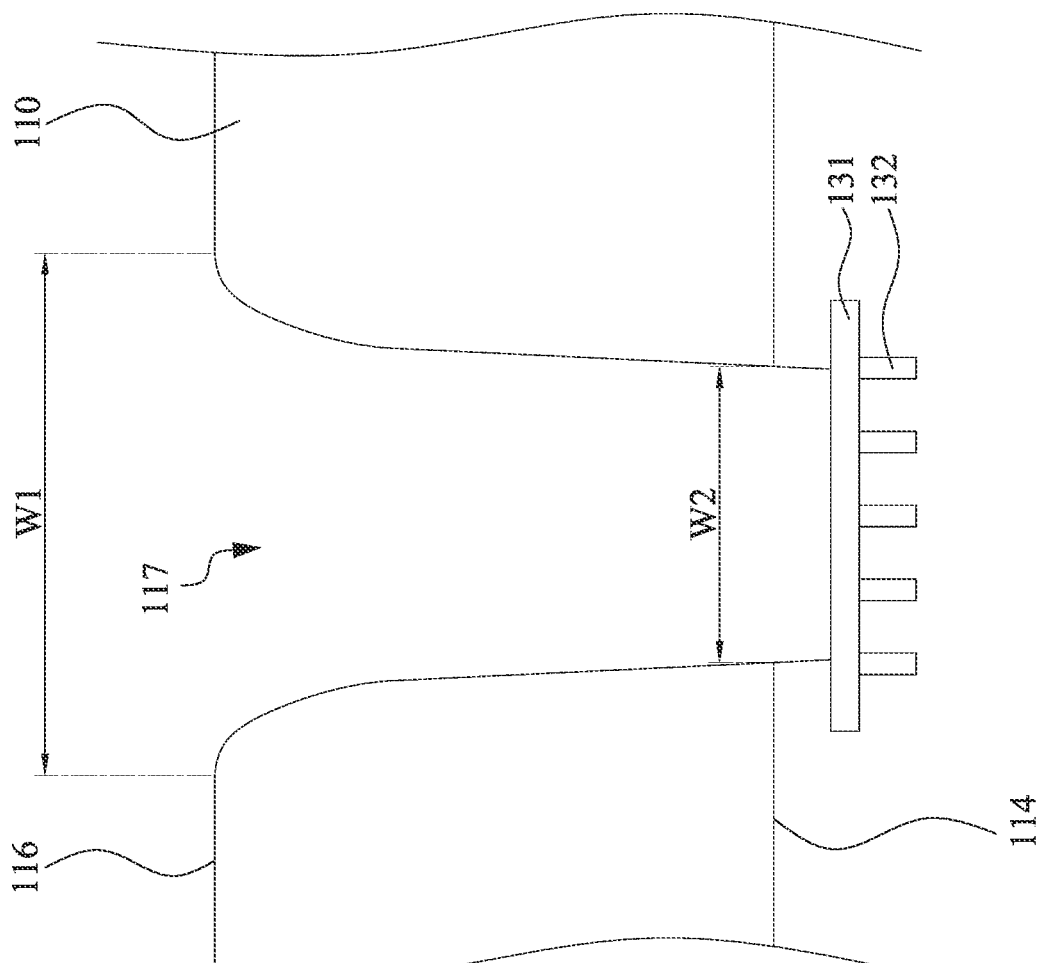
Figure 11C:
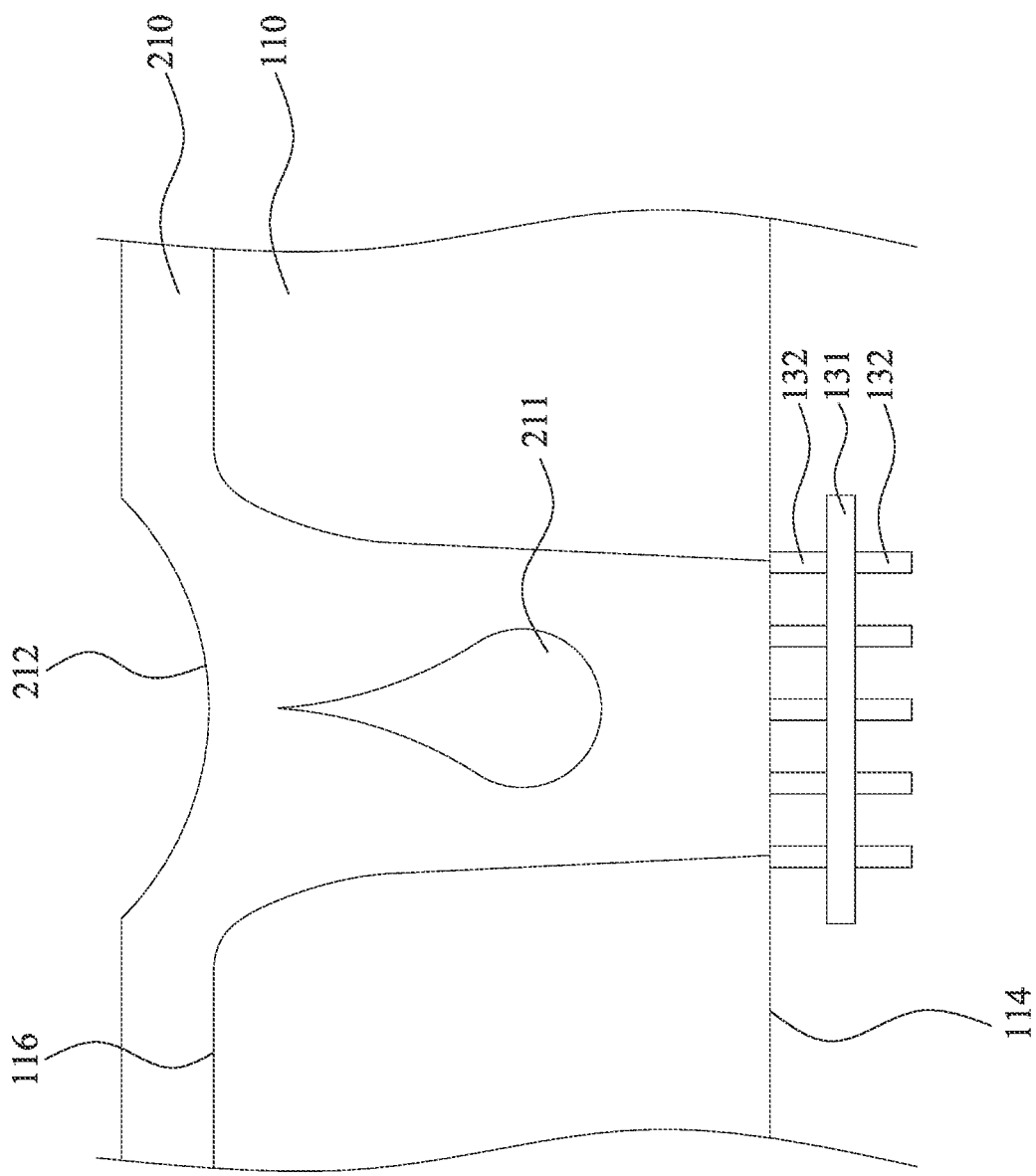
Figure 11D:
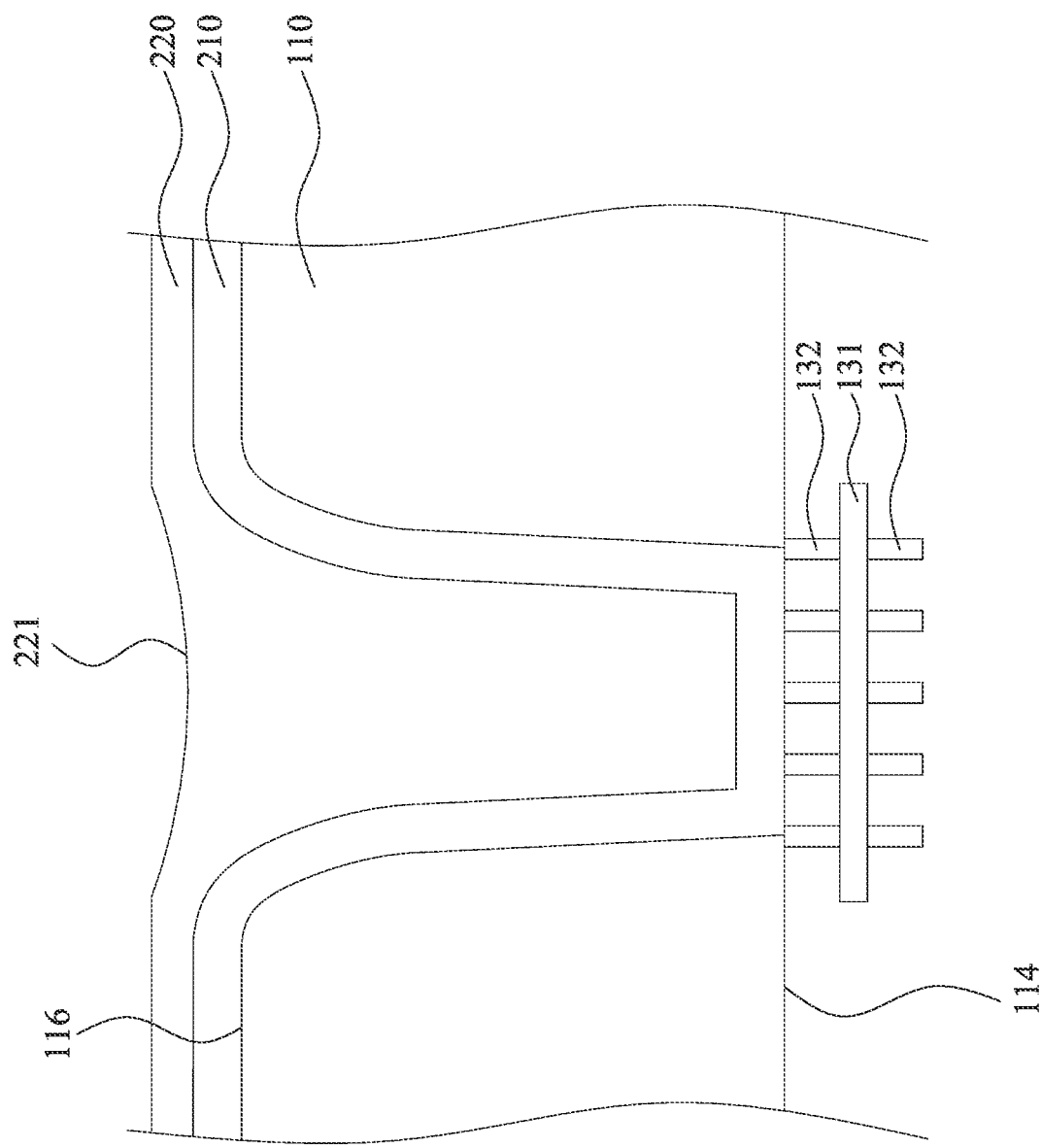

As illustrated by the cross-sectional view of FIG. 11C, in some embodiments, the operation for forming the isolation ring 111 includes first filling a dielectric layer 210 that covers the surface 116 of the substrate 110, the sidewalls and bottom of the through substrate trench 117. The dielectric layer 210 may be physically connected to the seal ring structure 130. The dielectric layer 210 may be physically connected to the via layer 132 of the seal ring structure 130. The dielectric layer 210 may be physically connected to the wiring layer 131 of the seal ring structure 130. The through substrate trench 117 may, for example, be formed by vapor deposition, atomic layer deposition, electrochemical planting, some other growth or deposition operation, or a combination of the foregoing. The dielectric layer 210 may have a dielectric constant less than or equal to about 6, for example but being not limited to, 0.5, 1, 1.5, 2, 2.5, 3, 3.5, 4, 4.5, 5, 5.5 or 6. Suitable materials for the dielectric layer 210 may be silicon dioxide, silicon nitride, silicon oxynitride, silicon carbide, some other dielectric, or a combination of the foregoing, In some embodiments, the dielectric layer 210 may have a concave upper or top surface 212 over the substrate 110. The dielectric layer 210 may have a convex upper or top surface 212 over the substrate 110. The dielectric layer 210 may have an overhang over the surface 116 of the substrate 110. In some embodiments, one or more voids 211 may be present in the dielectric layer 210. To reduce number of the voids 211, as illustrated by the cross-sectional view of FIG. 11D, a metal layer 220 can be disposed over the dielectric layer 220 before the dielectric layer 210 closes the opening of the through substrate trench 117. The metal layer 220 may be filled in the through substrate trench 117. The metal layer 220 may cover the seal ring structure 130. The metal layer 220 may cover the sidewalls of the through substrate trench 117. The metal layer 220 may covers the surface 116 of the substrate 110. The metal layer 220 cannot not be physically connected to the substrate 110. The metal layer 220 cannot not be electrically connected to the substrate 110. The metal layer 220 cannot not be physically connected to the seal ring structure 130. The metal layer 220 cannot not be electrically connected to seal ring structure 130. The metal layer 220 may be electrically isolated from the substrate 110 by the dielectric layer 210. The metal layer 220 may be electrically isolated from the seal ring structure 130 by the dielectric layer 210. The material of metal layer 220 suitable for the present disclosure may be, but not limited to, copper, aluminum, tungsten, some other conductive material, or a combination of the foregoing.

Figure 12A:
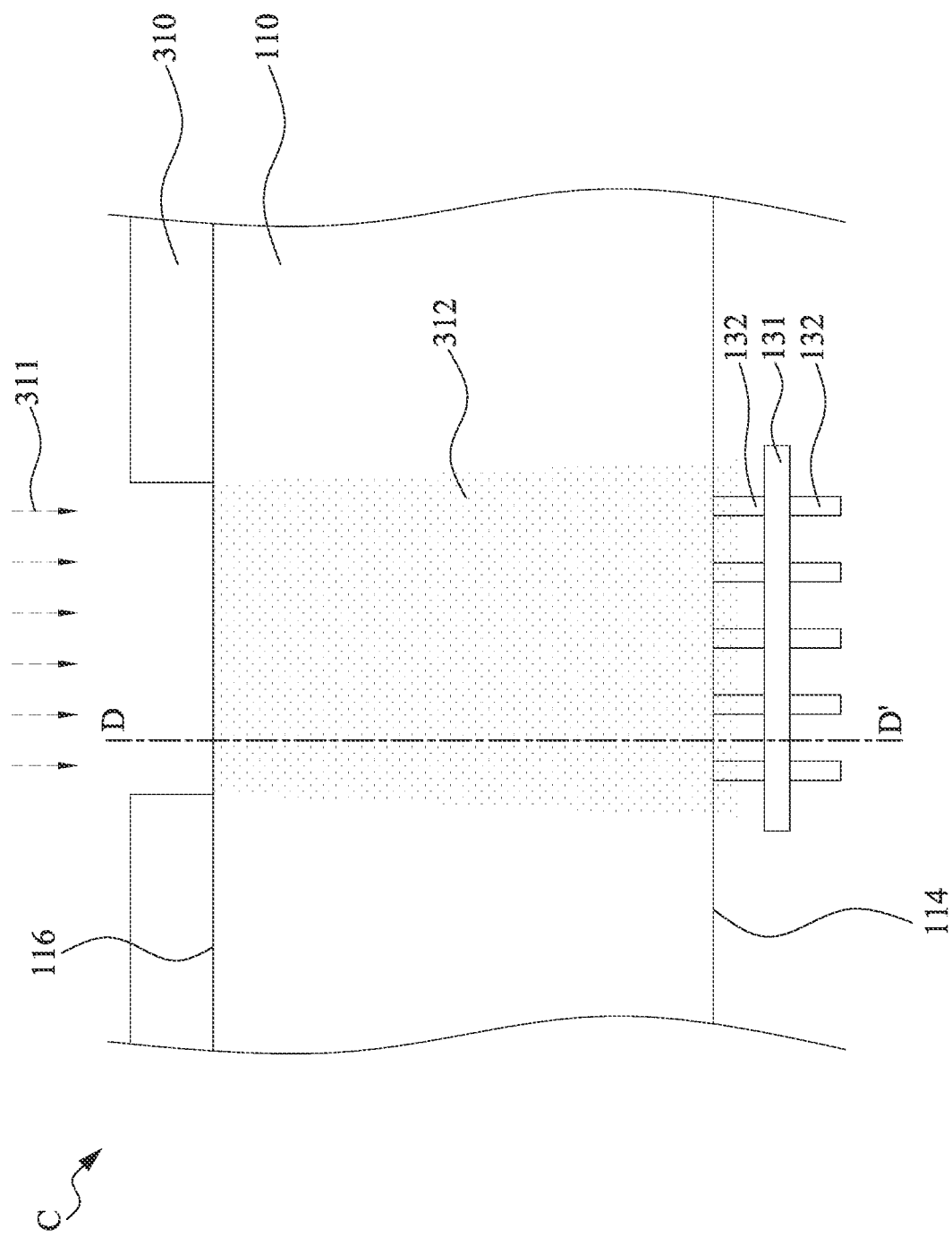

As illustrated by the cross-sectional view of FIG. 12A, in other embodiments, the isolation ring 111 may be in the form of a through substrate doped well 312. The through substrate doped well 312 may be formed by, for example, applying a patterned hard mask 310 on the substrate 110 and then applying one or more implants 311 having a doping polarity opposite to that of the substrate 110 to the substrate 110. For example, if the substrate has a p-type conductivity, the through substrate doped well 312 has an n-type conductivity, and vice versa. The through substrate doped well 312 may be physically connected to the isolation region 126 (not shown in the figures). The through substrate doped well 312 may be physically connected to the seal ring structure 130. The through substrate doped well 312 may be physically connected to the via layer 132 of the seal ring structure 130. The through substrate doped well 312 may be physically connected to the wiring layer 131 of the seal ring structure 130. After the through substrate doped well 312 has been formed in the substrate 110, the patterned hard mask 310 can be removed.

Figure 12B:
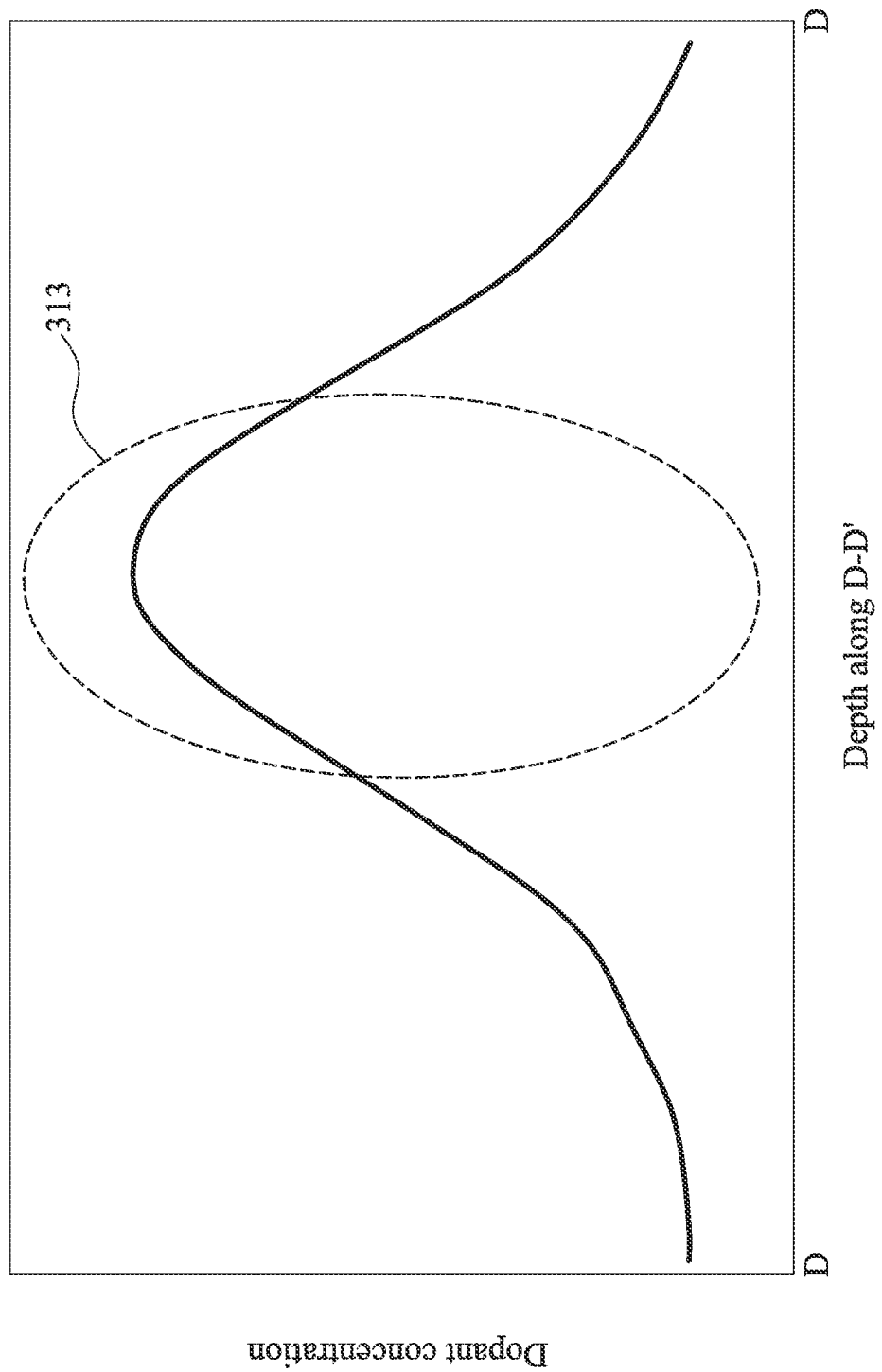

In some embodiment, the dopant 311 may be applied by an implantation operation with a fixed implant energy level. The through substrate doped well 312 in this regard may have a tapered cross-section along line B-B' in FIG. 2. FIG. 12B shows the implant profile of the dopant 311 along line in FIG. 12A in the substrate 110. As measured from the surface 116 of the substrate 110 to the surface 114, the implant has a distribution with one peak (referred to as a "dopant-rich cluster 313") between the surfaces 116 and 114 and close to the surface 114. The depth of the dopant-rich cluster 313 along the direction substantially normal to the surface 116 or 114 of the substrate 110 may be controlled by the implant energy level.

Figure 12C:
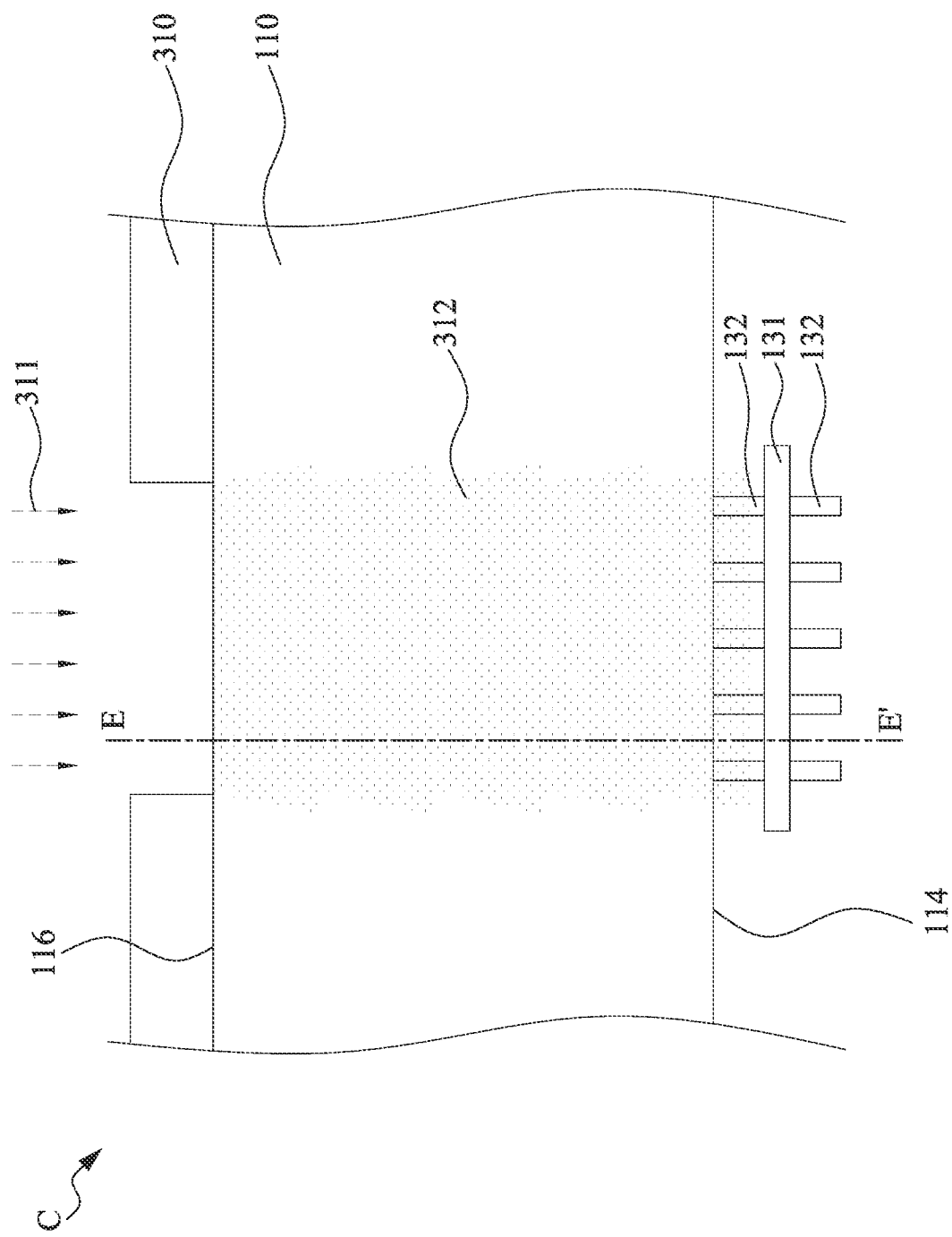
Figure 12D:
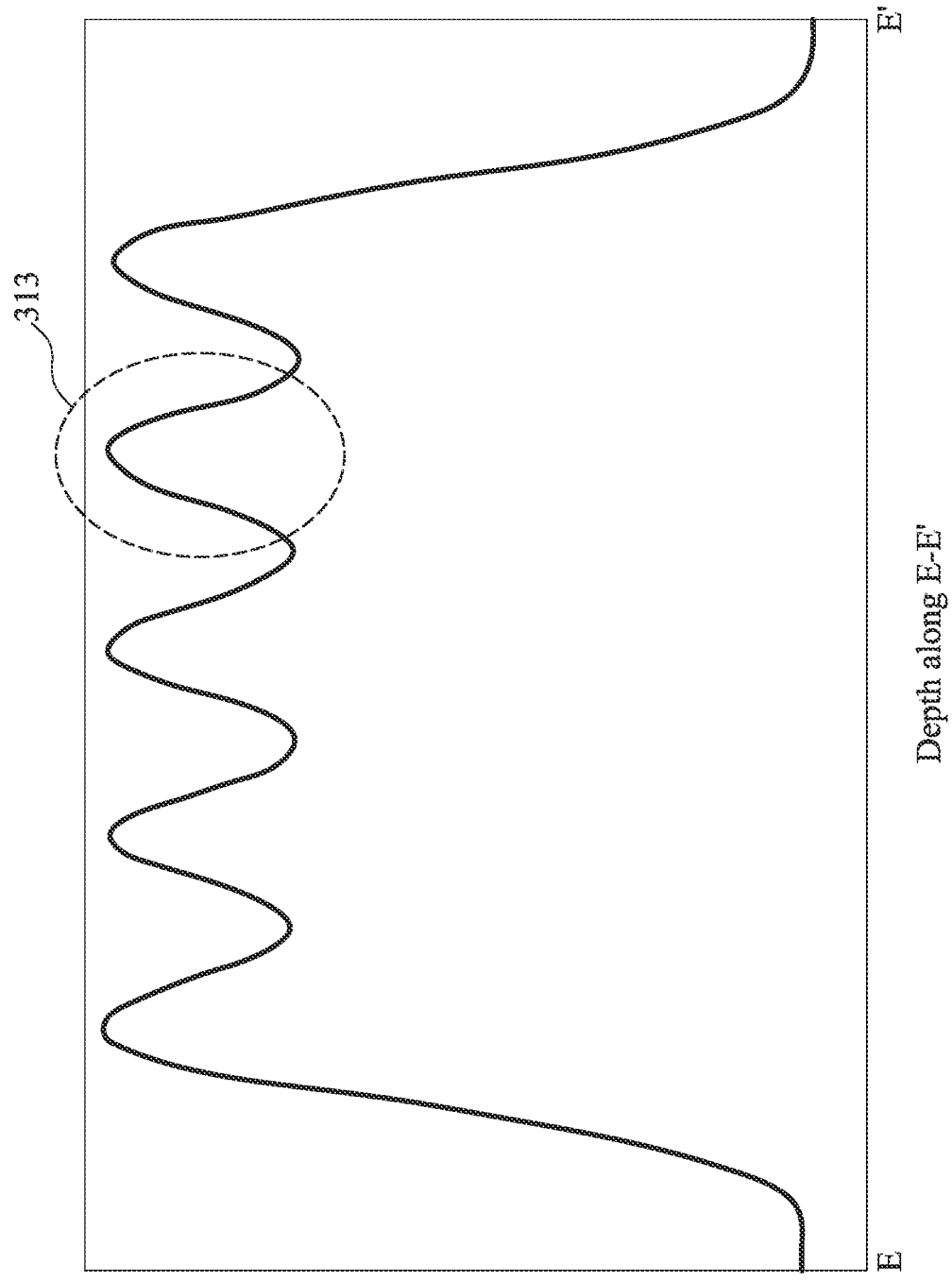

In some embodiment, the dopant 311 may be applied by an implantation operation with various implant energy levels, for example, with two, three, four or five different implant energy levels. With reference to FIG. 12C, the dopant 311 is applied by an implantation operation with five different implant energy levels. The through substrate doped well 312 in this regard may have a stacked tapered cross-section along line B-B' in FIG. 2. FIG. 12D shows the implant profile of the dopant 311 along line E-E' in FIG. 12C in the substrate 110. As measured from the surface 116 of the substrate 110 to the surface 114, the implant has a distribution with a plurality of peaks between the surfaces 116 and 114. For example, as shown in FIG. 12D, the through substrate doped well 312 has five dopant-rich clusters 313. The plurality of dopant-rich clusters 313 at varying depths along the direction substantially normal to the surface 116 or 114 of the substrate 110 may be formed by using substantially the same dopant concentration at different implantation energy levels.

After the implantation, a rapid thermal annealing at a temperature within a range of 1000° C. to 1100° C. for a time within a range of 100 seconds to 200 seconds may be performed. In some embodiments, the dopant in the through substrate doped well 312 may have a concentration of about $5 \times 10^{11}$ to about $5 \times 10^{14}$ cm$^{-3}$, for example but being not limited to, $5 \times 10^{11}$, $1 \times 10^{12}$, $5 \times 10^{12}$, $1 \times 10^{13}$, $5 \times 10^{13}$, $1 \times 10^{14}$ or $5 \times 10^{14}$ cm$^{-3}$.

In this disclosure the operation of forming the isolation ring 111 illustrated in FIGS. 10-12 can be performed either after or before the wafer bonding step illustrated in FIG. 9. In some embodiments, after the formation of the isolation ring 111, planarization may be performed on the substrate 110 to (1) thin the substrate 110 to a predetermined thickness, (2) adjust the height-to-width aspect ratio of the cross-section of the isolation ring 111 along line B-B' in FIG. 2, (3) coplanarize the upper or top surface 212 of the dielectric layer 210 with the surface 116 of the substrate 110, and/or (4) coplanarize the upper or top surface 221 of the metal layer 220 with the surface 116 of the substrate 110. The planarization may be performed by, for example, CMP and/or an etch back. In some embodiments, the height-to-width aspect ratio of the isolation ring 111 may be about 0.5 to about 3, for example but not limited to 0.5, 0.6, 0.7, 0.8, 0.9, 1, 1.2, 1.4, 1.5, 1.6, 1.8, 2, 2.2, 2.4, 2.5, 2.6, 2.8 or 3. In some embodiment, the height-to-width aspect ratio of the isolation ring 111 can be determined according to the following table:

| Equivalent dielectric constant* | Implant concentration (cm$^{-3}$) | Aspect ratio (height/width) |
|---|---|---|
| 0.5 to <2 | $5 \times 10^{11}$ to <$5 \times 10^{12}$ | 0.5 to <1 |
| 2 to <4 | $5 \times 10^{12}$ to <$5 \times 10^{13}$ | 1 to <2 |
| 4 to 6 | $5 \times 10^{13}$ to $5 \times 10^{14}$ | 2 to 3 |

*In this disclosure, if the isolation ring 111 includes more than one material, the equivalent dielectric constant of the materials that constitute the isolation ring 111 is taken into account.

Figure 13:
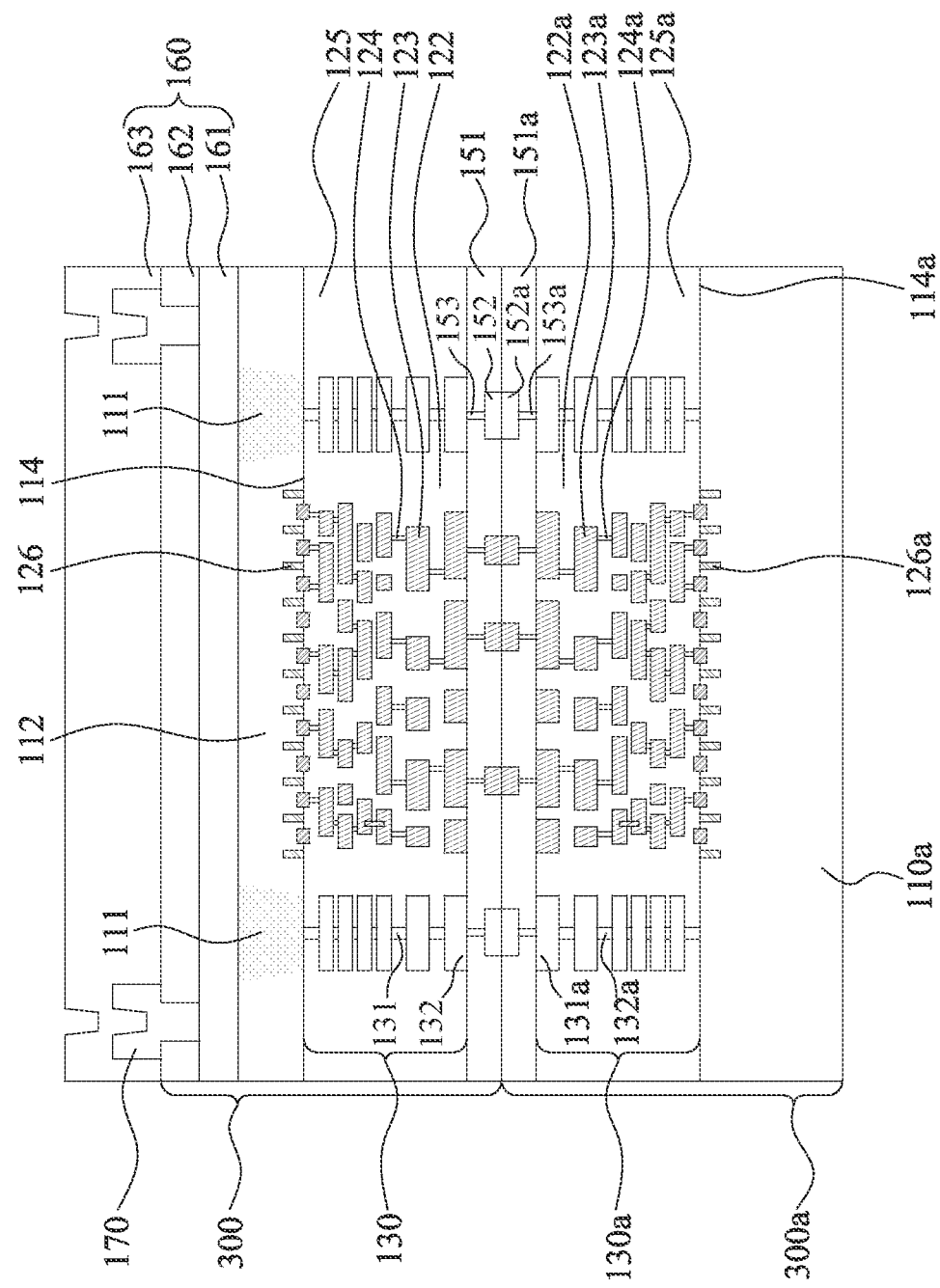

As illustrated by the cross-sectional view of FIG. 13, a passivation layer 160 is formed covering the substrate 110 and the isolation ring 111. The passivation layer 160 include a dielectric layer 161 and a dielectric layer 162 over the dielectric layer 161. Further, one or more pad electrodes 170 may be formed over the dielectric layer 161 and embedded in the dielectric layer 162. The pad electrode 170 is disposed over the dielectric layer 161 and overhangs the dielectric layer 162. The operation for forming the passivation layer 160 and the pad electrode 170 may, for example, be as described above in FIG. 6. Optionally, one or more dielectric layer 163 may be disposed over the dielectric layer 162 and may enclose the pad electrode 170. Finally, the 3DIC 400 illustrated in FIG. 4B can be obtained by a die sawing and packaging operation.

Figure 14:
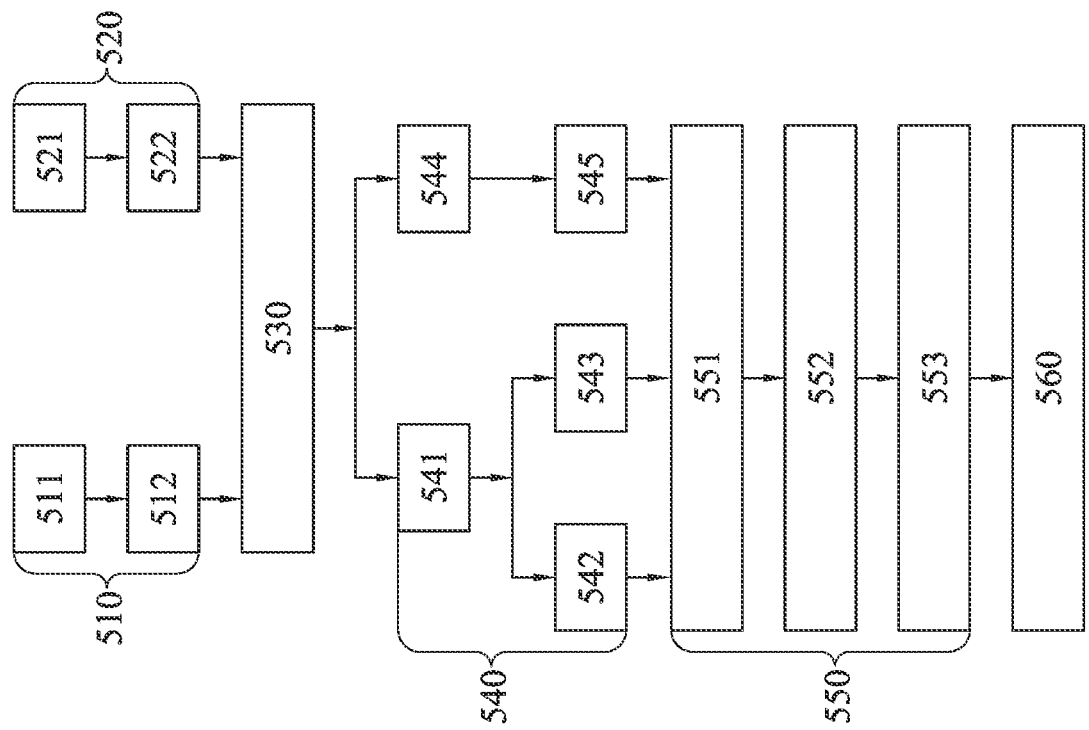
FIG. 14 shows a flowchart of the method of FIGS. 5-10, 11A-11D, 12A-12D, and 13.

With reference to FIG. 14, a flowchart 500 of some embodiments of the method of FIGS. 5 to 13 is provided. At 510, a first semiconductor structure with a first seal ring structure is formed. See, for example, FIGS. 5-8. At 511, a first interconnect structure and a first seal ring structure is formed over a first substrate having one or more transistors. The first interconnect structure is formed with an alternating stack of first wiring layers and first via layers. Further, the stack of first wiring layers and first via layers partially constitute the first seal ring structure. See, for example, FIGS. 6 and 7. At 512, a first HB structure is formed over the first interconnect structure and the first seal ring structure. The first HB structure is formed with a first HB contact layer and a first HB link layer over the first HB contact layer. See, for example, FIG. 8.

At 520, a second semiconductor structure with a second seal ring structure is formed. At 521, a second interconnect structure with a second seal ring structure is formed over a second substrate having one or more transistors. The second interconnect structure is formed with an alternating stack of second wiring layers and second via layers. Further, the stack of second wiring layers and second via layers partially constitute the second seal ring structure. At 522, a second HB structure is formed over the second interconnect structure and the second seal ring structure. The second HB structure is formed with a second HB contact layer and a second HB link layer over the second HB contact layer.

At 530, the first semiconductor structure is flipped and bonded to the second semiconductor structure, such that the first seal ring structure is over and contacts the second seal ring structure at an HB interface between the first and second HB structures. See, for example, FIGS. 9 and 10.

At 540, an isolation ring is formed in the first substrate of the first semiconductor structure. At 541, a first etch is performed on the first substrate to form a through substrate trench that exposes the first seal ring structures. See, for example, FIGS. 11A and 11B. At 542, a dielectric material is formed in the through substrate trench to cover the surface and side walls of the substrate and the first seal ring structure. See, for example, FIG. 11C. At 543, as an alternative approach, a dielectric material is formed in the through substrate trench to cover the surface and side walls of the substrate and the first seal ring stricture. Then, a metal layer is formed over the dielectric material. See, for example, FIG. 11D.

Also, as an alternative of 541 to 543, at 544, a patterned hard mark is formed over the first substrate. At 545, an implantation with a fixed implant energy level or various implant energy levels is performed on the predetermined regions of the first substrate to form a through substrate doped well. The through substrate doped well has one or more dopants and one or more dopant-rich clusters having a doping polarity opposite to that of the first substrate. See, for example, FIGS. 12A-12D. After the through substrate doped well has been formed in the first substrate, the patterned hard mask can be removed.

At 550, one or more dielectric layers as a passivation layer and one or more pad electrodes are formed over the first substrate. At 551, forming the passivation layer is preceded by optionally thinning the first substrate containing the isolation ring. The thinning may be performed by, for example, a planarization, such as CMP. At 552, a first dielectric layer is formed over the first semiconductor structure and the isolation ring, and a second dielectric layer is formed over the first dielectric layer. At 553, one or more pad electrodes are formed over the first dielectric layer and to overhang the second dielectric layer. The pad electrode is embedded in the second dielectric layer. Optionally, one or more additional dielectric layers can be formed covering the pad electrode and the second dielectric layer. See, for example, FIG. 13. At 560, a 3DIC according to the present disclosure can be obtained by a die sawing and packaging operation.

While the flowchart 500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 15:
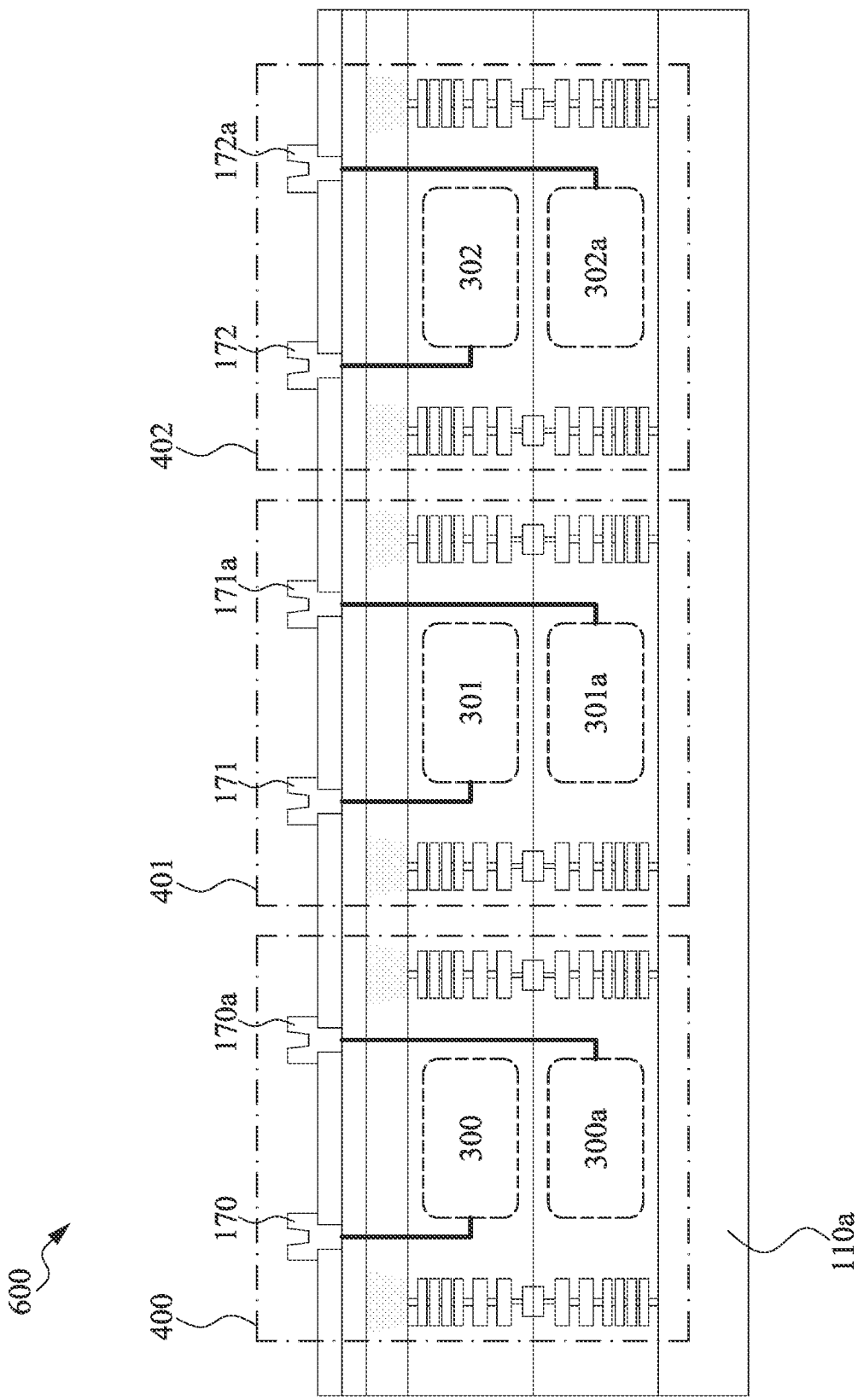
FIG. 15 shows a possible configuration of a wafer including the 3DICs according to some embodiments of the present disclosure under a CP test.

The inventors of the present disclosure have surprisingly found that the semiconductor structure according to the present disclosure advantageously shows a reduced dark current under a CP test. The reduced dark current is helpful for improving either the signal-to-noise ratio of the output signals or the reliability of the CP test. With reference to FIG. 15, in some embodiments, a wafer 600 including a plurality of 3DICs 400, 401 and 402 is provided. The 3DICs 401 and 402 are the same as the 3DIC 400 as described above. The 3DICs 400, 401 and 402 are electrically and physically separated to each other by their respective scribe lines and seal ring structures. The 3DICs 400, 401 and 402 have at least a pad electrode 170, 171 or 172 connected to their respective semiconductor structure 300, 301 or 302 close the pad electrodes (upper structure) and at least a pad electrode 170a, 171a or 172a connected to their respective semiconductor structure 300a, 301a or 302a away from the pad electrodes (lower structure). The semiconductor structure 301 and 302 may be the same as the semiconductor structure 300 as described above. The semiconductor structure 301a and 302a may be the same as the semiconductor structure 300a as described above, In some embodiments, when the CP test is conducted by biasing the substrate 110a at about −10 Volts and by electrically connecting the pad electrode 170a and the pad electrode 171 with the set of probers 3, the measured dark current at $V_{ss}=0$ is about ten to the power of negative fifth of the comparative wafer that is free of the isolation rings. In other embodiments, when the CP test operation conducted by biasing the substrate 110a at about −10 Volts and by electrically connecting the pad electrode 171 and the pad electrode 172 with the set of probers 3, the measured dark current at $V_{ss}=0$ is about ten to the power of negative sixth of the comparative wafer that is free of the isolation rings. Without being bound by theory, it is believed that the absence of the isolation ring according to the present disclosure in the substrate 110, the negative biasing at the substrate 110a may cause bias shorting between the power domains of any of the two semiconductor structures provided on a common wafer. In this regard, the semiconductor structure according to the preset disclosure provides improved isolation for the 3DICs.

In view of the foregoing, some embodiments of the present application provide a semiconductor structure, including: a substrate including an isolation ring extending in the direction substantially parallel to the surface of the substrate, an active region over the substrate and laterally enclosed by the isolation ring, a seal ring structure over the substrate, the seal ring structure laterally enclosing the active region and including at least a wiring layer and at least a via layer, and an encapsulant material laterally enclosing the seal ring structure.

Further, other embodiments of the present application provide a semiconductor structure, including: a first substrate including an isolation ring extending in the direction substantially parallel to the surface of the first substrate, a first seal ring structure over the first substrate, the first seal ring structure including at least a first wiring layer and at least a first via layer, and a first bonding structure over the first seal ring structure, a second bonding structure over the first bonding structure, a second seal ring structure over the second bonding structure, and a second substrate over the second seal ring structure, wherein the first seal ring structure extends from the first substrate to the first bonding structure, and the second seal ring structure extends from the second bonding structure to the second substrate.

Further yet, other embodiments of the present application provide A method of manufacturing a semiconductor structure, including: providing a first substrate, providing a first seal ring structure over the first substrate, the first seal ring structure including at least a wiring layer and at least a via layer, providing a first bonding structure over the first seal ring structure, and forming an isolation ring within the first substrate, the isolation ring having a projection at the surface of the first substrate that overlaps the first seal ring structure and extending in the direction substantially parallel to the surface of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising an isolation ring extending in the direction substantially parallel to a first surface of the substrate;
   an active region over the first surface of the substrate and laterally enclosed by the isolation ring;
   a seal ring structure over the substrate, the seal ring structure laterally enclosing the active region and comprising at least a wiring layer and at least a via layer;
   a bonding structure over the seal ring structure, the bonding structure comprising at least a bonding dielectric layer, at least a bonding link layer, and at least a bonding contact layer, the bonding link layer and the bonding contact layer being enclosed by the bonding dielectric layer, a surface of the bonding dielectric layer and a surface of the bonding link layer being in coplanar relationship, the bonding link layer being connected to the seal ring structure by way of the bonding contact layer, and the bonding link layer being electrically coupled to the active region;
   and
   an encapsulant material laterally enclosing the seal ring structure,
   wherein the isolation ring comprises a dielectric material and a metal,
   wherein the metal is electrically isolated by the dielectric material from the substrate,
   wherein the metal is electrically isolated by the dielectric material from the seal ring structure,
   wherein the dielectric material is physically connected to the seal ring structure,
   wherein the seal ring structure overlapped with the metal in a direction perpendicular to the first surface of the substrate.

2. The semiconductor structure according to claim 1, wherein the seal ring structure has a projection at the first surface of the substrate that overlaps the isolation ring.

3. The semiconductor structure according to claim 1, wherein the at least a via layer is physically connected to the isolation ring.

4. The semiconductor structure according to claim 1, further comprising a passivation layer disposed over a second surface opposite to the first surface of the substrate.

5. The semiconductor structure according to claim 4, wherein the passivation layer comprises a first dielectric layer and a second dielectric layer over the first dielectric layer.

6. The semiconductor structure according to claim 5, wherein the passivation layer comprises a pad electrode embedded in the first dielectric layer.

7. The semiconductor structure according to claim 6, wherein the second dielectric layer encloses the pad electrode.

8. A semiconductor structure, comprising:
   a first substrate comprising an isolation ring extending in the direction substantially parallel to a first surface of the first substrate;
   a first seal ring structure over the first surface of the first substrate, the first seal ring structure comprising at least a first wiring layer and at least a first via layer;
   a first bonding structure over the first seal ring structure, the bonding structure comprising at least a first bonding dielectric layer, at least a first bonding link layer, and at least a first bonding contact layer, the first bonding link layer and the first bonding contact layer being enclosed by the first bonding dielectric layer, a surface of the first bonding dielectric layer and a surface of the first bonding link layer being in coplanar relationship, and the first bonding link layer being connected to the first seal ring structure by way of the first bonding contact layer;
   a second bonding structure over the first bonding structure, the second bonding structure comprising at least a second bonding dielectric layer, at least a second bonding link layer, and at least a second bonding contact layer, the second bonding link layer and the second bonding contact layer being enclosed by the second bonding dielectric layer, a surface of the second bonding dielectric layer and a surface of the second bonding link layer being in coplanar relationship, and the second bonding link layer being connected to the first bonding link layer;
   a second seal ring structure over the second bonding structure, the second seal ring structure being connected to the second bonding link layer by way of the second bonding contact layer; and
   a second substrate over the second seal ring structure,
   wherein the first seal ring structure extends from the first substrate to the first bonding structure, and the second seal ring structure extends from the second bonding structure to the second substrate,
   wherein the isolation ring comprises a dielectric material and a metal, wherein the metal is electrically isolated by the dielectric material from the first substrate, wherein the metal is electrically isolated by the dielectric material from the first seal ring structure, wherein the dielectric material is physically connected to the first seal ring structure, wherein the first seal ring structure overlapped with the metal in a direction perpendicular to the first surface of the first substrate.

9. The semiconductor structure according to claim 8, wherein the first seal ring structure has a projection at the first surface of the first substrate that covers the projection of the isolation ring at the first surface of first substrate.

10. The semiconductor structure according to claim 8, wherein the at least a first via layer is physically connected to the isolation ring, the at least a first via layer has a projection at the first surface the first substrate within the projection of the isolation ring at the first surface of the first substrate.

11. The semiconductor structure according to claim 8, further comprising a passivation layer disposed over a second surface opposite to the first surface of the first substrate.

12. The semiconductor structure according to claim 11, wherein the passivation layer comprises a first dielectric layer and a second dielectric layer over the first dielectric layer.

13. The semiconductor structure according to claim 12, wherein the passivation layer comprises a pad electrode embedded in the first dielectric layer.

14. The semiconductor structure according to claim 13, wherein the second dielectric layer encloses the pad electrode.

15. A semiconductor structure, comprising:
a substrate comprising an isolation ring extending in a direction substantially parallel to a first surface of the substrate;
an active region over the first surface of the substrate and laterally enclosed by the isolation ring;
a seal ring structure over the substrate, the seal ring structure comprising at least a wiring layer and at least a via layer, wherein the at least a via layer is physically connected to the isolation ring; and
a bonding structure over the seal ring structure, the bonding structure comprising at least a bonding dielectric layer, at least a bonding link layer, and at least a bonding contact layer, the bonding link layer and the bonding contact layer being enclosed by the bonding dielectric layer, a surface of the bonding dielectric layer and a surface of the bonding link layer being in coplanar relationship, the bonding link layer being connected to the seal ring structure by way of the bonding contact layer, and the bonding link layer being electrically coupled to the active region, wherein the isolation ring comprises a dielectric material and a metal, wherein the metal is electrically isolated by the dielectric material from the substrate, wherein the metal is electrically isolated by the dielectric material from the seal ring structure, wherein the dielectric material is physically connected to the seal ring structure, wherein the seal ring structure overlapped with the metal in a direction perpendicular to the first surface of the substrate.

16. The semiconductor structure according to claim 15, further comprising a passivation layer disposed over a second surface opposite to the first surface of the substrate.

17. The semiconductor structure according to claim 16, wherein the passivation layer comprises a first dielectric layer and a second dielectric layer over the first dielectric layer.

18. The semiconductor structure according to claim 17, wherein the passivation layer comprises a pad electrode embedded in the first dielectric layer.

19. The semiconductor structure according to claim 18, wherein the second dielectric layer encloses the pad electrode.

20. The semiconductor structure according to claim 15, wherein the at least a via layer is physically connected to the dielectric material.

* * * * *